United States Patent
Kawashima et al.

(10) Patent No.: US 7,009,686 B2
(45) Date of Patent: Mar. 7, 2006

(54) EXPOSURE METHOD

(75) Inventors: Miyoko Kawashima, Tochigi (JP); Kenji Yamazoe, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 28 days.

(21) Appl. No.: 10/666,211

(22) Filed: Sep. 19, 2003

(65) Prior Publication Data

US 2004/0057036 A1    Mar. 25, 2004

(30) Foreign Application Priority Data

Sep. 19, 2002    (JP)    ............... 2002-272626

(51) Int. Cl.
G03B 27/32    (2006.01)
G03B 27/42    (2006.01)
G03B 27/54    (2006.01)
G03B 27/72    (2006.01)

(52) U.S. Cl. ...................... 355/67; 355/53; 355/71; 355/77

(58) Field of Classification Search .............. 355/53, 355/67, 71, 77
See application file for complete search history.

(56) References Cited

U.S. PATENT DOCUMENTS

| 5,245,470 | A | * | 9/1993 | Keum .................... 359/485 |
| 5,459,000 | A | | 10/1995 | Unno |
| 5,541,026 | A | | 7/1996 | Matsumoto |
| 5,673,103 | A | * | 9/1997 | Inoue et al. .............. 355/71 |
| 6,259,512 | B1 | * | 7/2001 | Mizouchi .................. 355/67 |
| 6,310,679 | B1 | * | 10/2001 | Shiraishi .................. 355/53 |
| 6,404,482 | B1 | * | 6/2002 | Shiraishi .................. 355/53 |
| 6,788,389 | B1 | * | 9/2004 | Fujishima et al. .......... 355/67 |
| 6,831,731 | B1 | * | 12/2004 | Omura et al. ............. 355/67 |

FOREIGN PATENT DOCUMENTS

| JP | 4-366841 | 12/1992 |
| JP | 5-88356 | 4/1993 |
| JP | 5-90128 | 4/1993 |
| JP | 6-124872 | 5/1994 |
| JP | 6-188167 | 6/1994 |
| JP | 6-188169 | 7/1994 |

* cited by examiner

*Primary Examiner*—Rodney Fuller
(74) *Attorney, Agent, or Firm*—Morgan & Finnegan, L.L.P.

(57) ABSTRACT

An exposure method includes the steps of illuminating a pattern formed on a mask using an illumination system that forms an effective light source having a first part that includes only s-polarized light and a second part that mixes s-polarized light and p-polarized light, and projecting, through a projection optical system, light from the mask onto an object to be exposed.

8 Claims, 23 Drawing Sheets

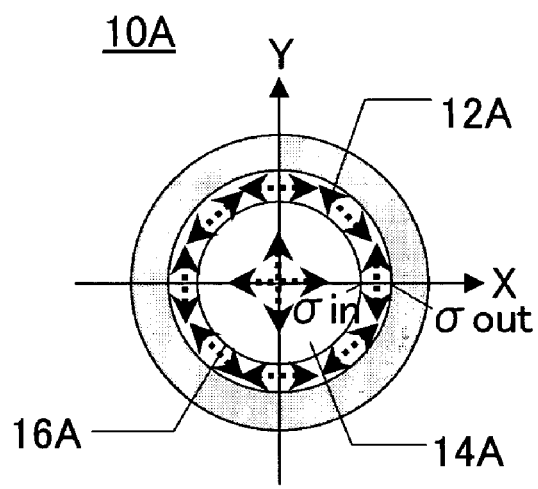
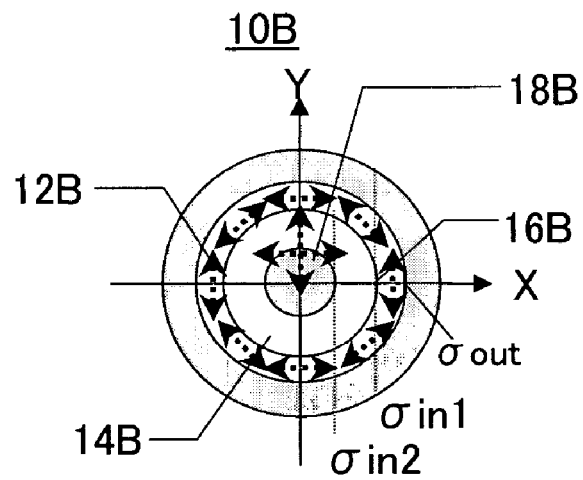
FIG. 1A  FIG. 1B
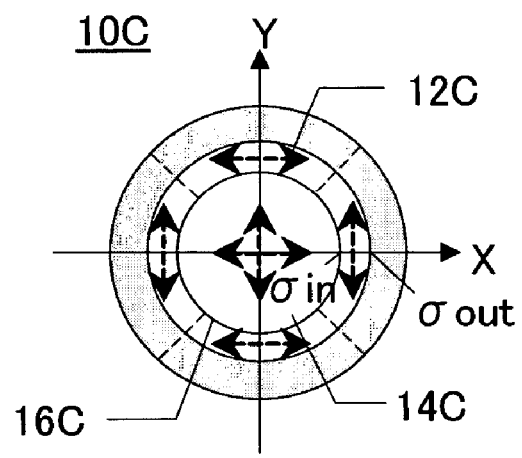
FIG. 1C

POLARIZATION DIRECTION (S-POLARIZED LIGHT)

RESOLVED PATTERN EFFECTIVE LIGHT SOURCE SHAPE

EXPOSURE METHOD

This application claims a benefit of a foreign priority based on Japanese Patent Application No. 2002-272626, filed on Sep. 19, 2002, which is hereby incorporated by reference herein in its entirety as if fully set forth herein.

BACKGROUND OF THE INVENTION

The present invention relates generally to exposure, and more particularly to an exposure method used to fabricate various devices including semiconductor chips such as ICs and LSIs, display devices such as liquid crystal panels, sensing devices such as magnetic heads, and image pick-up devices such as CCDs, as well as fine contact hole patterns used for micromechanics. Here, the "micromechanics" is technology for applying the semiconductor IC fabricating technique for fabrications of a fine structure, thereby creating an enhanced mechanical system that may operate at a level of micron.

Reduction projection exposure apparatuses have been conventionally employed which use a projection optical system for projecting a circuit pattern formed on a mask (reticle) onto a wafer, etc. and for transferring the circuit pattern, in manufacturing such fine semiconductor devices as semiconductor memories and logic circuits in the photolithography technology.

The critical dimension transferable by the projection exposure apparatus or resolution is proportionate to a wavelength of light used for exposure, and inversely proportionate to the numerical aperture ("NA") of the projection optical system. The shorter the wavelength is, the better the resolution is. Smaller resolution has recently been demanded with a demand for finer semiconductor devices. only the exposure light with a small wavelength has the limit to meet this requirement, and the projection optical system is expected to improve resolution using higher NA. At present, a projection optical system has accelerated an improvement of its NA; for example, a projection optical system having NA=0.9 has been developed.

It has been reported that influence on imaging performance becomes non-negligible for high NA due to polarization, because the imaging performance becomes different according to polarizations as an incident angle becomes larger. For high NA, the conventional scalar theory cannot predict the imaging performance in a polarization direction of light. Instead, the vector diffraction theory, which precisely regards light as electromagnetic waves, may describe influence on imaging performance due to polarization.

The imaging performance for two-beam interference is more affected by polarization than that for three-beam interference that forms an image when a 0-th order light and $\pm 1^{st}$ order diffracted beams interfere with each other.

The three-beam interference forms an image through interference among 0th-order light and $\pm 1^{st}$ order diffracted beams, while an angle is equal to or less than 45° between 0th-order light and one of $\pm 1^{st}$ order diffracted beams. On the other hand, an angle is close to 90° at most between 0th-order light and one of $\pm 1^{st}$ order diffracted beams in the two-beam interference.

It is known that mutually orthogonally polarized wave fronts neither interfere with each other nor form an image. Therefore, even when an angle between $\pm 1^{st}$ order diffracted beams becomes so close to 90° that they hardly interfere with each other, the influence is small because 0-th order light and one of $\pm 1^{st}$ order diffracted beams interfere with each other. On the contrary, the impact is serious for the two-beam interference when an angle between 0-th order light and one of $\pm 1^{st}$ order diffracted beams becomes so close to 90° that they hardly interfere with each other.

As discussed, high NA of the projection optical system is necessary for finer patterns, while it is suggested that the imaging performance deteriorates due to polarization of the high NA and the desired pattern cannot be formed. In other words, while high NA of the projection optical system is vital to form fine patterns, an associative phenomenon of deteriorated imaging performance needs to be solved. Nevertheless, few reports have discussed polarization-caused influence on the imaging performance in detail, and an exposure apparatus that may control polarization has not yet been proposed.

BRIEF SUMMARY OF THE INVENTION

Accordingly, it is an exemplified object of the present invention to provide an exposure apparatus which prevents deteriorated imaging performance due to influence of polarization and may form a desired pattern.

An exposure method of one aspect according to the present invention includes the steps of illuminating a pattern formed on a mask using an illumination system that forms an effective light source having a first part that includes only s-polarized light and a second part that mixes s-polarized light and p-polarized light, and projecting, through a projection optical system, light from the mask onto an object to be exposed. The phrase "mixes s-polarized light and p-polarized light" means the light may be linear polarized light, circular polarized light, non-polarized light different from s-polarized light.

The first part may have an annular shape in which the s-polarized light polarizes in a tangential direction of the annular shape. The second part may have a circular or annular shape that is located inside the first part. Light intensity of the second part may be smaller than that of the first part.

An exposure method of another aspect according to the present invention that uses an illumination system that forms a predetermined effective light source using light from a light source to illuminate a mask, and projects a pattern formed on the mask onto an object to be exposed via a projection optical system includes the steps of splitting the light into s-polarized light and p-polarized light, and forming a first frequency component among frequency components of the effective light source by inputting the s-polarized light into a surface approximately conjugate with a pupil of the projection optical system, and forming a second frequency component lower than the first frequency component by inputting a mixture of the s-polarized light and p-polarized light into the surface. The forming step may be conducted at a side closer to the light source than an optical integrator provided between the light source and the mask.

An exposure method of still another aspect according to the present invention that exposes a pattern formed on a mask onto an object via a projection optical system using light from a light source includes the steps of splitting the light into s-polarized light and p-polarized light, and inputting the s-polarized light into a predetermined area of a pupil in the projection optical system, and inputting light that mixes the s-polarized light and the p-polarized light inside the predetermined area of the pupil.

An exposure method of still another aspect according to the present invention that exposes a pattern formed on a mask onto an object via a projection optical system using light from a light source includes the steps of splitting the light into s-polarized light and p-polarized light, and introducing the s-polarized light into a first part around a center axis that passes through a center of a pupil, in a periphery around the pupil of the projection optical system, and a mixture of the s-polarized light and the p-polarized light into a second part other than the first part in the periphery around the pupil, the first part being parallel to a periodic direction of the pattern. The introducing step may introduce the s-polarized light into a third part around the center axis and an axis orthogonal to the center axis in the periphery around the pupil of the projection optical system, and a mixture of the s-polarized light and the p-polarized light into a fourth part other than the third part. The polarization direction may be controlled so that the desired pattern is resolved by s-polarization light and the auxiliary pattern is prevented from resolving by the light that mixes the s-polarization light and the p-polarization light.

Regarding light from the mask, the above exposure method defines an effective light source distribution on a pupil in a projection optical system with respect to 0-th order diffracted light of light for illuminating the mask.

An exposure method of another aspect according to the present invention that uses plural types of light to project onto an object to be exposed through a projection optical system, a mask that arranges a desired pattern of an auxiliary pattern smaller than the desired pattern so that the desired pattern is resolved and the auxiliary pattern is prevented from resolving includes the step of forming a predetermined effective light source by controlling a polarization direction.

An illumination system of one aspect according to the present invention includes a mechanism that forms an effective light source by inputting s-polarized light into a frequency component for resolving a fine pattern, and by inputting light that mixes the s-polarization light and p-polarization light into a frequency component that resolves a pattern other than the fine pattern.

An illumination system of another aspect according to the present invention includes an effective light source that includes a first part that includes only s-polarized light, and a second part that mixes the s-polarized light and p-polarized light.

An exposure apparatus of another aspect according to the present invention includes an exposure mode that may execute the above exposure method.

An exposure apparatus includes the above illumination optical system, and a projection optical system that uses the effective light source formed by said illumination optical system to project a pattern formed on a reticle or mask onto an object to be exposed.

A device fabricating method of still another aspect of the present invention includes the steps of exposing an object using the above exposure apparatus, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BRIEF DESCRIPTION OF THE DRAWINGS

FIG. 1 is a schematic view showing an exemplary effective light source shape proposed by the present invention.

FIG. 5 is a plane view that divides the effective light source shape shown in FIG. 4 into two.

DETAILED DESCRIPTION OF THE PREFERRED EMBODIMENTS

Figure 2:
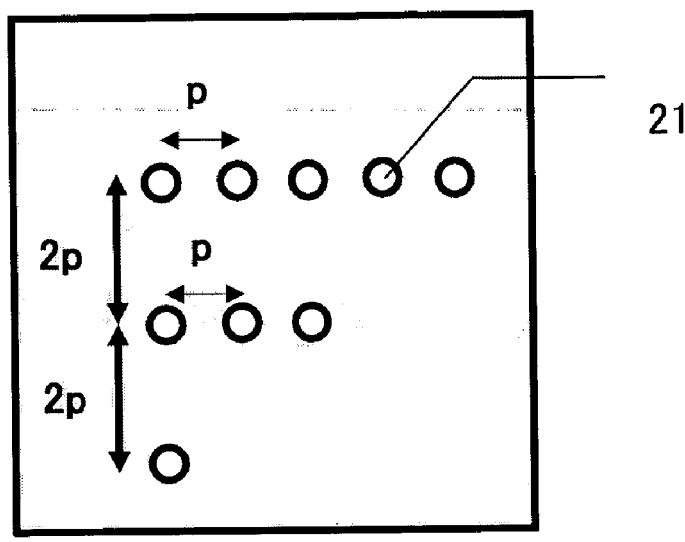
FIG. 2 is a schematic plane view showing a contact hole pattern.

Referring now to the accompanying drawings, a description will be now given of an exposure apparatus 1 according to the present invention. The same element in each figure is designated by the same reference numeral, and a duplicate description will be omitted.

As a result of earnest research of influence on imaging performance of polarization under high NA, e.g., NA=0.9 (at the maximum incident angle of 64°), the instant inventors have found that the vector theory states that there is a contrast difference due to polarization states and this difference appears remarkably in the two-beam interference. A description will now be given of influence of the polarization on the imaging performance when a PSM is used.

Figure 12A:
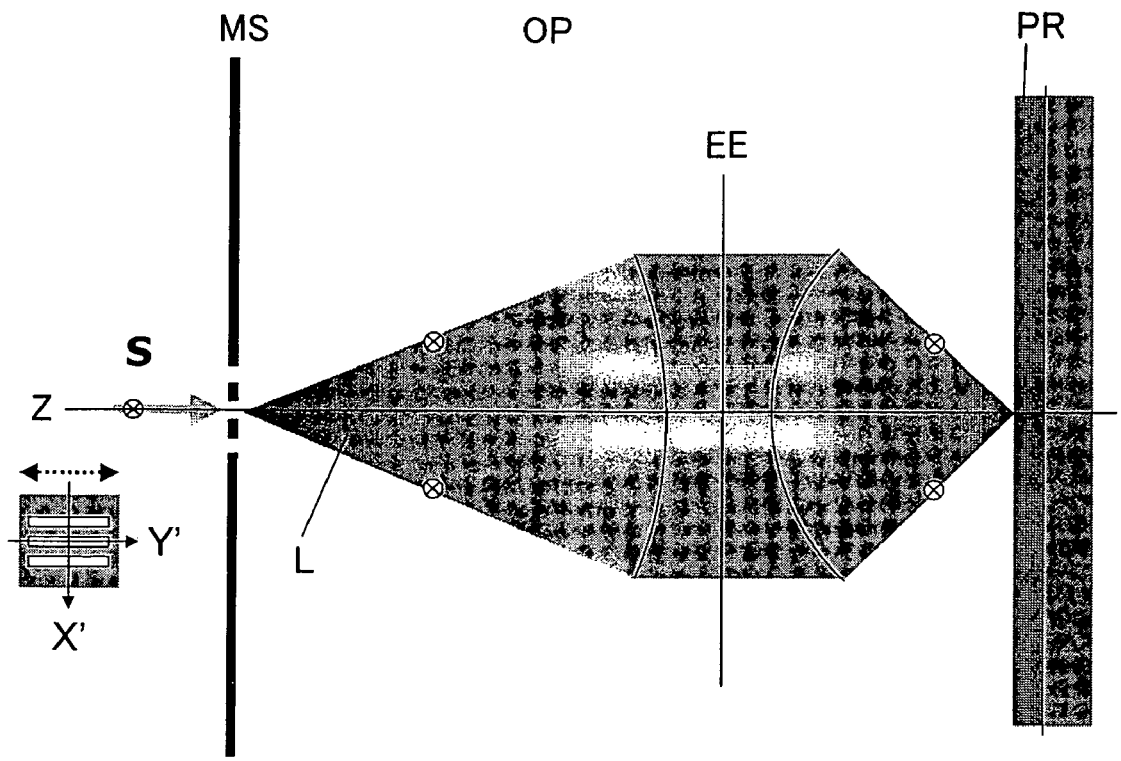
FIG. 12 is a typical view for defining s-polarized light and p-polarized light.
Figure 12B:
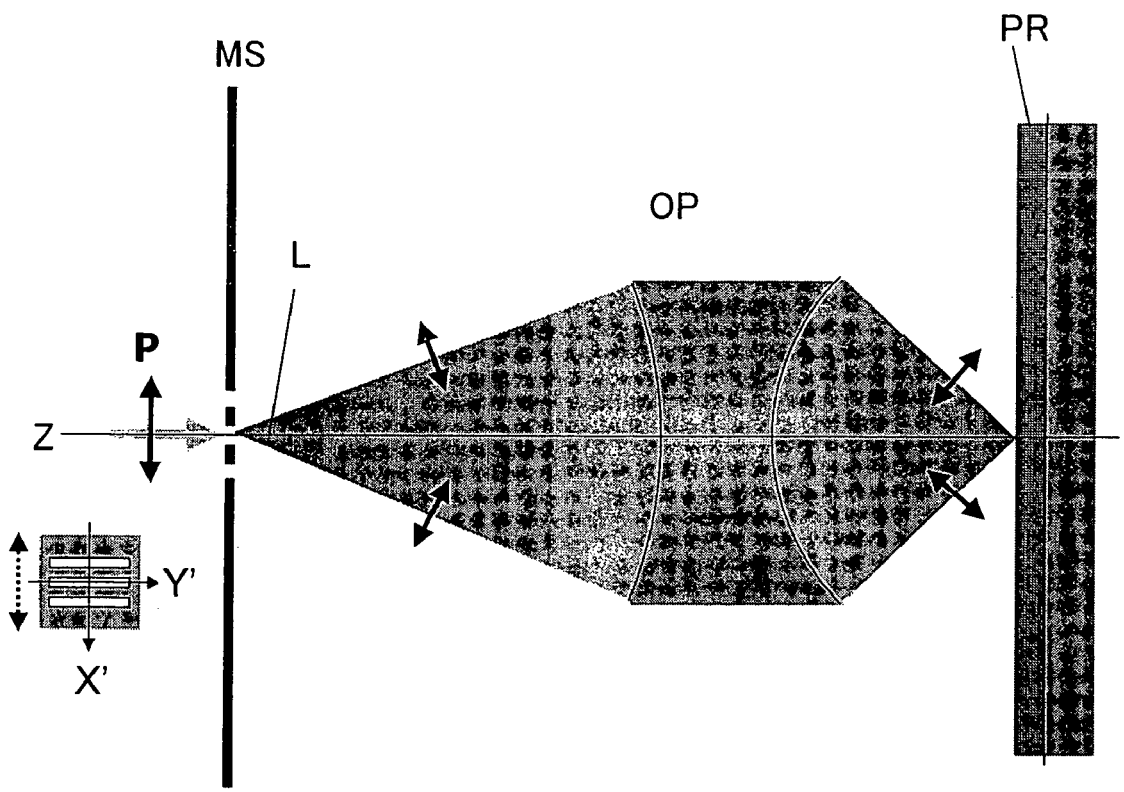
Figure 13:
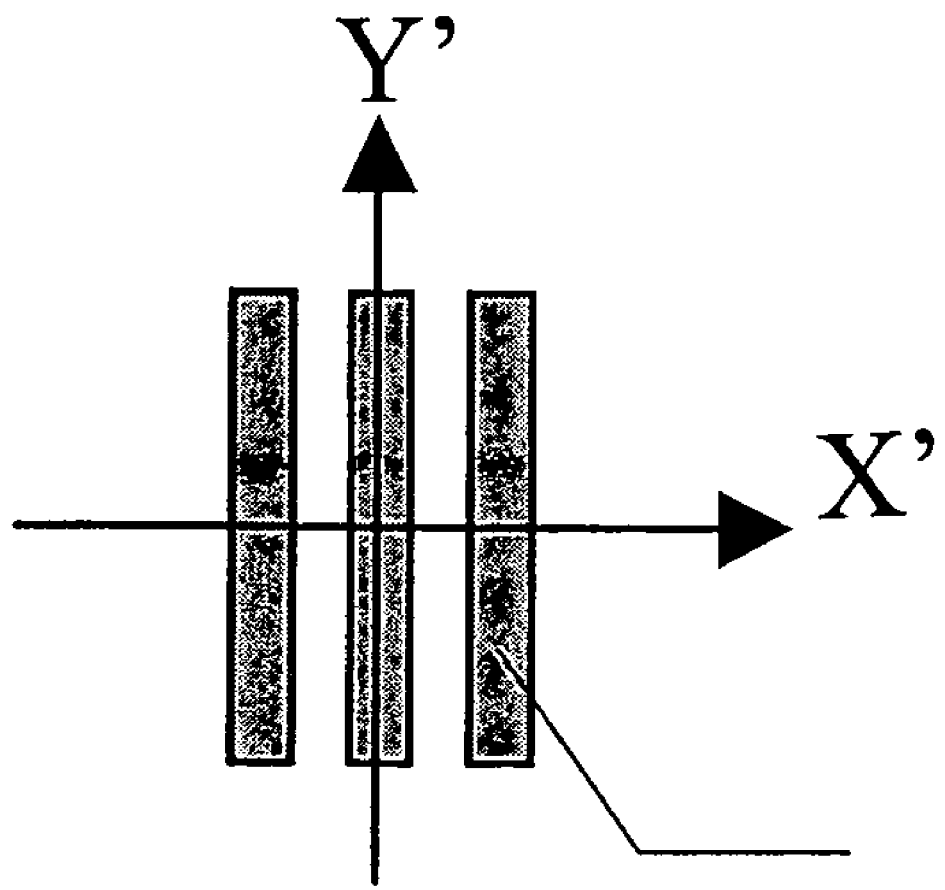
FIG. 13 is a typical view of a mask pattern that repeats in an X-axis direction.

The polarization is defined as follows: S-polarized light is polarized light L in a direction perpendicular to a section of a projection optical system OP as shown in FIG. 12A. P-polarized light is polarized light L in a direction parallel to a section of a projection optical system OP as shown in FIG. 12A. Here, FIG. 12 is a typical view that defines p-polarized light and p-polarized light. In other words, s-polarized light polarizes in a Y'-axis direction, while p-polarized light polarizes in an X'-axis direction, where a Z axis is a progress direction of the light L, the X' axis is a direction orthogonal to the Z axis and parallel to a section (or paper surface) of the projection optical system OP, and the Y' axis is a direction orthogonal to the section (or paper surface) of the projection optical system OP. The contrast of a pattern 141 will be calculated using the s-polarized light and p-polarized light, which repeats in the X'-axis direction as shown in FIG. 13. FIG. 13 is a typical view of a mask pattern that repeats in the X'-axis direction.

Figure 14:
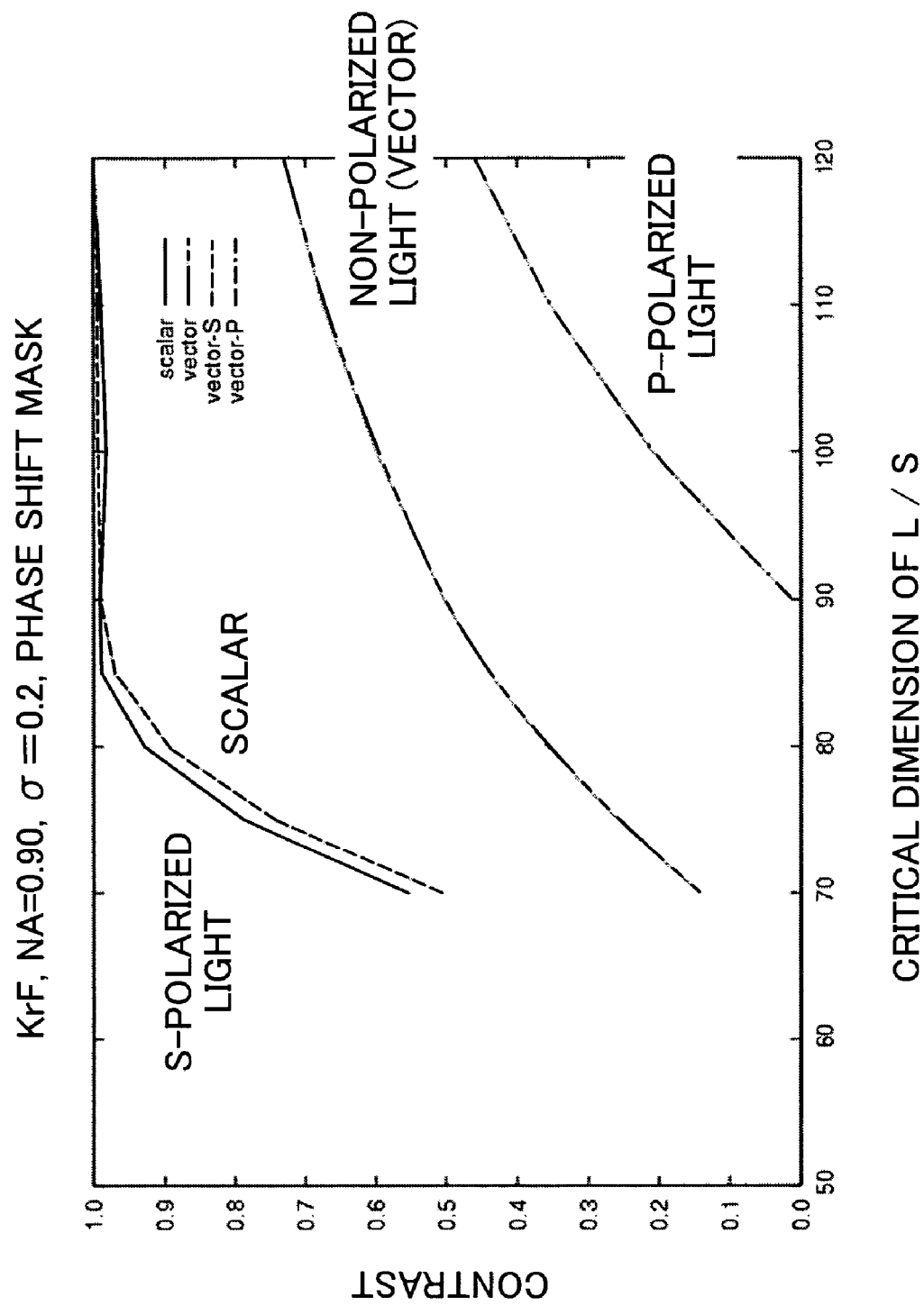
FIG. 14 is a graph showing a relationship between a critical dimension and contrast in an L/S pattern.

When an exposure apparatus that has KrF excimer laser with a wavelength $\lambda$ of 248 nm as a light source, and NA=0.9 exposes a PSM with p-polarized light, s-polarized light, and non-polarized light, a contrast of an aerial image is as shown in FIG. 14. The PSM has a line and space ("L/S") pattern that inverts phases of adjacent patterns. Here, FIG. 14 is a graph showing a relationship between a critical dimension and a contrast in an L/S pattern, where an abscissa axis is a critical dimension of the L/S or a half pitch length, and an ordinate axis is a contrast at a best focus or a contrast peak in a focus range.

Referring to FIG. 14, the contrast of the s-polarized light is approximately equal to the contrast of the conventional scalar theory, and the contrast of the p-polarized light drastically reduces to zero when L/S=90 nm. When L/S=90 nm, two diffracted beam directions are orthogonally intersect and these two diffracted beams do not interfere with each other. While the non-polarized state that mixes the s-polarized light and the p-polarized light averages their respective values, the contrast becomes much lower than that expected in the conventional scalar theory.

Figure 15:
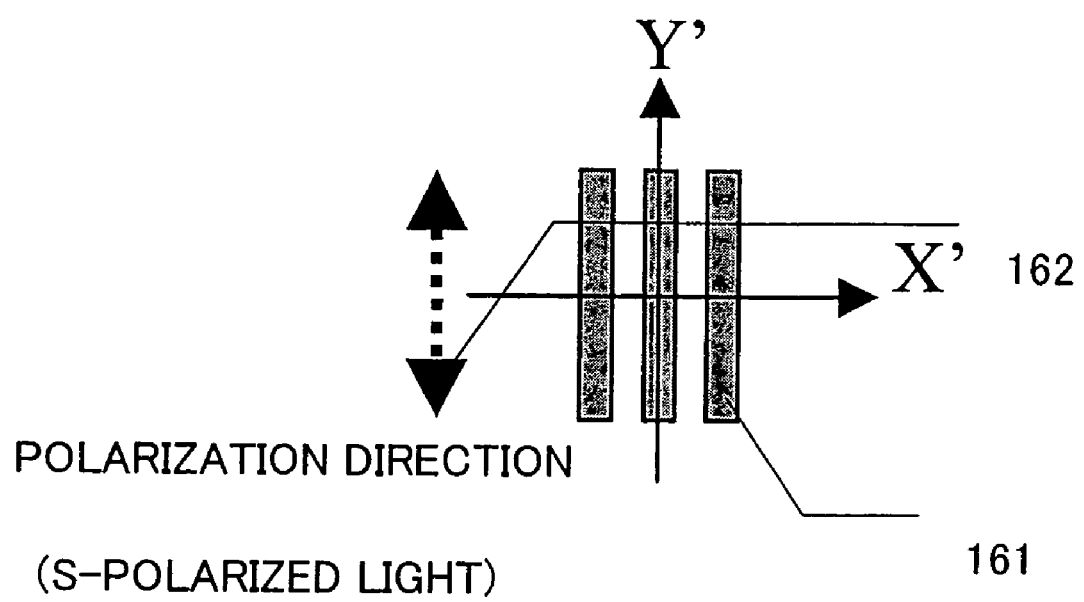
FIG. 15 is a typical view showing a relationship between a pattern forming direction and a polarization direction.

In order to achieve high-resolution imaging performance as predicted by the scalar theory, the p-polarized light is removed from light that includes the p-polarized light and the s-polarized light, and only the s-polarized light may be used for imaging a pattern. That is, as shown in FIG. 15, s-polarized light 162 that has a polarization direction in the Y'-axis direction is usable to image, at high resolution, a line pattern 161 as a mask pattern that elongates in a Y'-axis direction. FIG. 15 is a typical view showing a relationship between a pattern forming direction and a polarization direction.

Referring to the projection optical system OP shown in FIG. 12, when the light emitted from an exit pupil EE and directing to a resist surface PR as an image surface is the s-polarized light, a pattern on an image surface images with high contrast.

Therefore, it is conceivable to insert a pupil filter into the pupil EE that absorbs or reflects only the p-polarized light or an optical element that absorbs or reflects only the p-polarized light between the reticle MS and the pupil EE.

However, when the p-polarized light absorber is inserted into the pupil EE, this element generates heat when absorbing light, causing changes of refraction indexes and shapes to peripheral optical elements, and disadvantageously generating aberration.

When a reflector for reflecting only the p-polarized light is inserted into the pupil EE, the reflected light is absorbed in other part of the projection optical system OP, such as an optical element, similarly causing thermal aberration, or the light that is not absorbed in other part in the projection optical system OP scatters in the projection optical system OP, becomes flare light that does not contribute imaging, and deteriorates contrast.

A similar problem occurs even when an optical element for absorbing or reflecting the p-polarized light is inserted between the reticle MS and the pupil EE, and control over polarization is difficult in the projection optical system OP.

Figure 16:
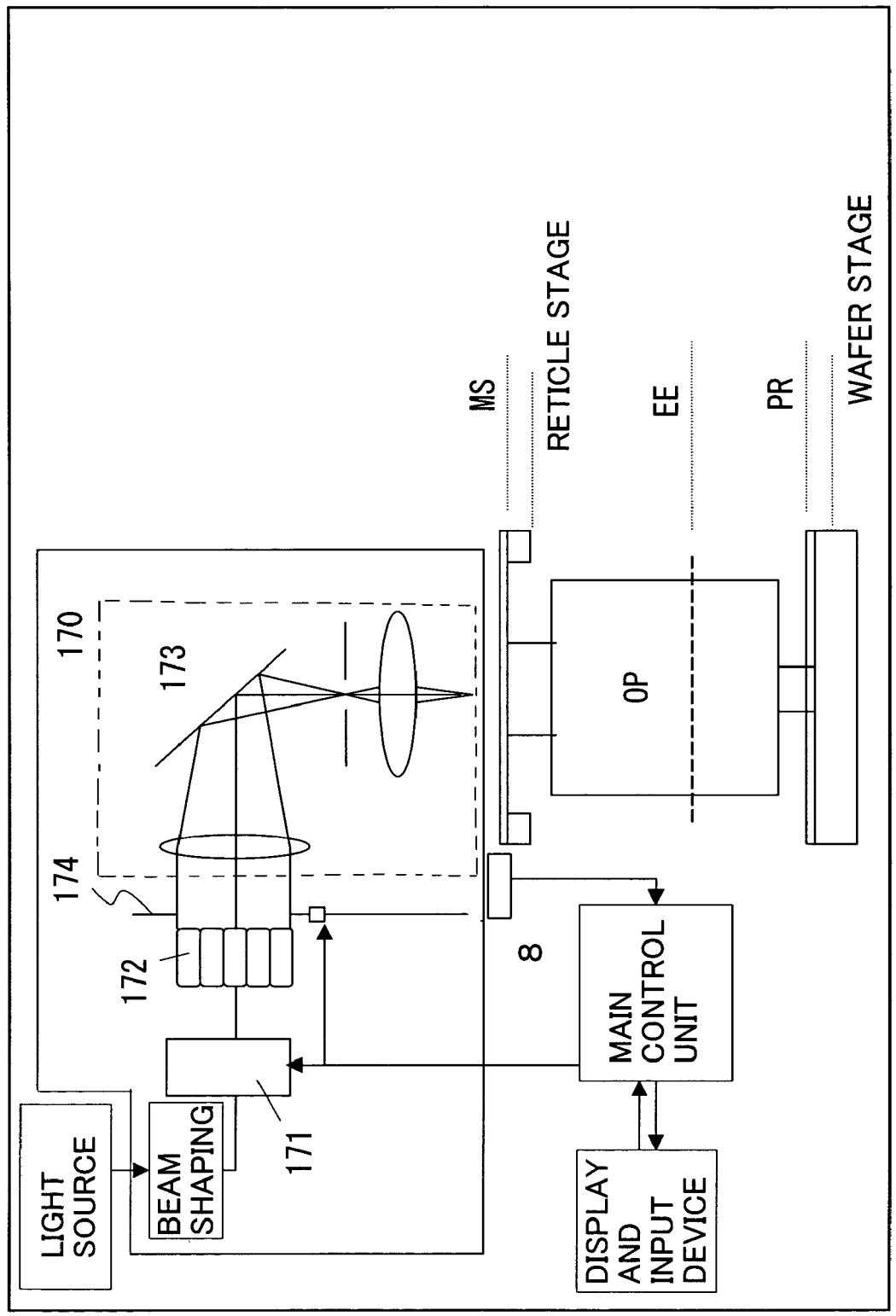
FIG. 16 is a schematic structure of an exposure apparatus.

Therefore, it is preferable to control polarization prior to the reticle MS or in the illumination optical system so that only the s-polarized light is irradiated into the reticle MS. Therefore, the reticle MS is irradiated only by the s-polarized light using the illumination optical system shown in FIG. 16. In FIG. 16, it is most effective to control the polarization between an optical system 171 and an optical integrator 172, because an optical system 173 subsequent to the optical integrator 172, particularly in the illumination optical system 170, is to form light suitable for the irradiation to the reticle MS. As a result of an insertion of a filter prior to the optical integrator 172, the optical system 173 subsequent to the optical integrator 172 may correct light scattering and thermal aberration near the filter to some extent. Here, FIG. 16 is a schematic structure of the exposure apparatus.

Figure 17:
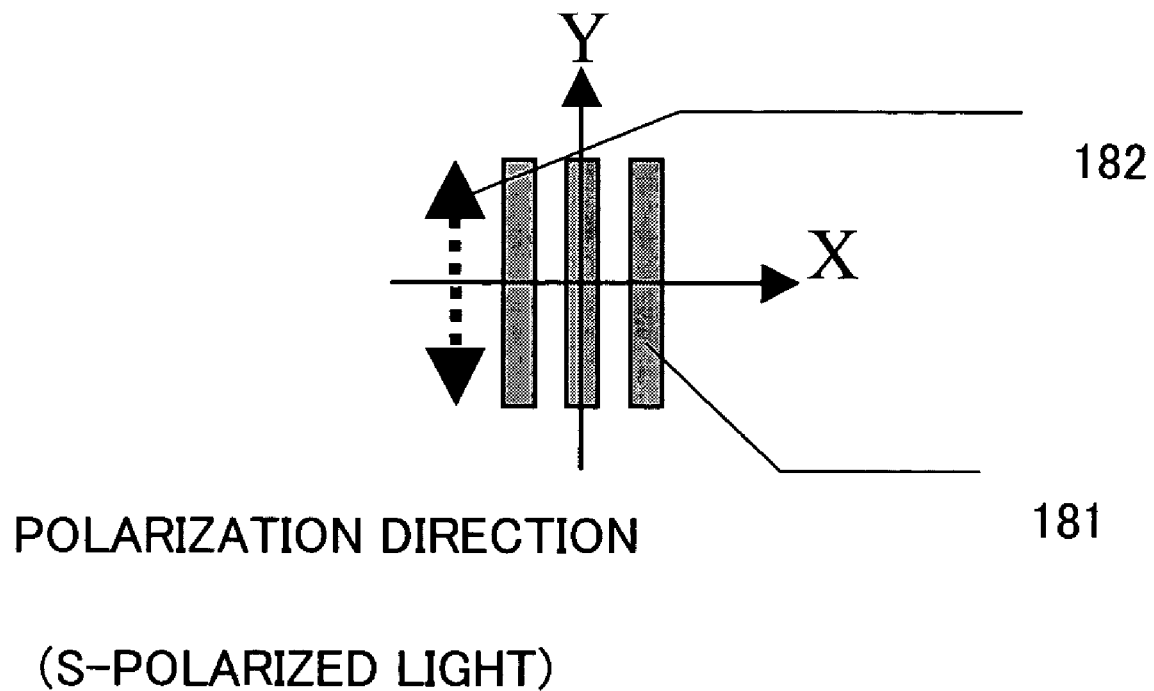
FIG. 17 is a typical view showing a relationship between a pattern repeating direction and a polarization direction.
Figure 18:
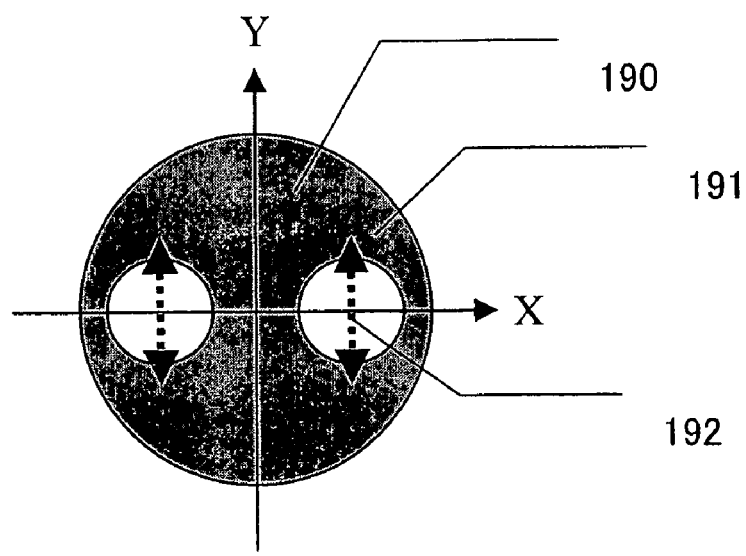
FIG. 18 is a schematic view showing one example of an effective light source shape used to resolve a pattern shown in FIG. 17.

Imaging performance improves for a binary mask that has a pattern 181 that periodically repeats in an X-axis direction as shown in FIG. 17, when light 182 that polarizes in a direction orthogonal to a repetitive period is used for illumination. An effective light source in this case, or a distribution projected on a pupil in the projection optical system of an illumination light distribution is preferably a dipole type effective light source shape shown in FIG. 18 which includes bipolar circular effective light sources 191 that have controlled polarization directions 192 in arrow directions in FIG. 18. Here, FIG. 17 is a typical view showing a relationship between a pattern repeating direction and a polarization direction. FIG. 18 is a schematic view showing one example of an effective light source shape used to resolve a pattern shown in FIG. 17.

Figure 19:
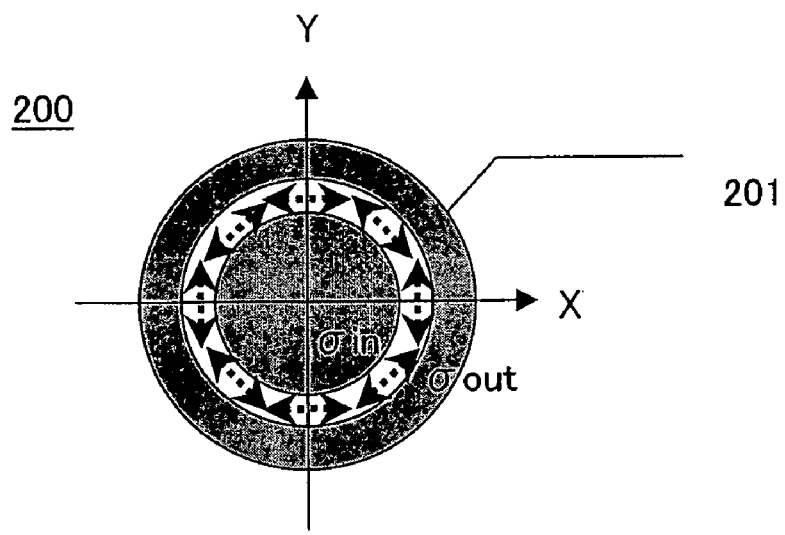
FIG. 19 is a schematic view of one example of an effective light source shape used to resolve a pattern in various directions.

An effective light source shape 200 is known as shown in FIG. 19 in order to resolve patterns in various directions. The effective light source shape 200 controls a polarization direction in an annular illumination, and more particularly, an effective light source 201 has an annular shape, and the polarization direction of this effective light source 201 is controlled to be a tangential direction (or an arrow direction in FIG. 19) of the annular effective light source 201. Here, FIG. 19 is a schematic view of one example of an effective light source shape used to resolve a pattern in various directions.

In the effective light source shape 200, the more outwardly a position in the effective light source 201 is located, the more light that contributes to resolution of a fine L/S pattern is available. Therefore, a fine periodic pattern resolves when an inside σin of the effective light source 201 is close to an outside σout of the effective light source 201. However, the resolution performance of the entire pattern deteriorates, and imaging performance deteriorates in a direction orthogonal to a periodic direction of the L/S pattern and a difference occurs between a critical dimension of a periodic pattern and a periodic pattern of an isolated pattern. In order to avoid this phenomenon, a width of the annular illumination is made large, or the inside σin of the effective light source 201 is made small.

When a frequency component of an effective light source is considered, it is clear from a graph shown in FIG. 14 that the degree of deterioration of imaging performance by the p-polarized light changes between a high-frequency component around the pupil in the projection optical system and a low-frequency component of the inside. The shorter the half pitch length as an abscissa axis is in the graph shown in FIG. 14, the larger the light incident angle becomes; thus, the deterioration of imaging performance by the p-polarized light becomes large as an angle between two beams becomes close to a right angle. The deterioration of imaging performance by the p-polarized light becomes small when the half pitch length becomes long.

Therefore, the low frequency component inside the pupil of the projection optical system is less subject to contrast deterioration of an image due to differences of polarization directions, and the polarization direction does not have to be considered. On the contrary, in the low-frequency component inside the pupil of the projection optical system, the light that has no specific polarization direction or mixes the s-polarized light and p-polarized light improves resolution performance in view of homogeneity, etc. so as to entirely resolve the non-fine pattern, a non-periodic pattern or a non-L/S and comparatively large pattern. Therefore, light of a wide range of frequency components is needed from the inside of the pupil to the outside in order to improve the entire image quality of various patterns formed on a reticle. However, the imaging performance depends upon a polarization direction of light of a high-frequency component outside the pupil, but does not depend upon a polarization direction of light of a low-frequency component outside the pupil. Here, the light that mixes the s-polarized light and p-polarized light may be linearly polarized, circularly polarized light or non-polarized light different from the s-polarized light. In addition, the linear polarization may be polarized in a direction from a center of a pupil of the projection optical system to the outside, or a radial direction.

For the above reasons, the present invention proposes effective light source shapes 10A and 10B as shown in FIGS. 1A and 1B, so as to improve resolution performance of a fine pattern and homogeneity of resolution performance of an L/S pattern and an isolated pattern.

The effective light source shape 10A shown in FIG. 1A uses s-polarized light that polarizes in a tangential direction of an annular shape for a first, annular part 12A from σin to σout in the effective light source 16A in order to resolve a fine pattern, and a non-polarized state that mixes the s-polarized light and p-polarized light for a second, circular part 14A inside σin in order to entirely resolve a non-fine pattern.

When the light intensity of the second part 14A inside σin is made smaller than that of the first part 12A outside σin, the resolution may be maintained for a fine pattern. Equation 1 below defines σin where L is a length of a fine pattern for which resolution performance is demanded to improve, λ is a wavelength, and NA is a numerical aperture of a projection optical system: σin=λ/(4L·NA)

Alternatively, the effective light source shape 10B shown in FIG. 1B may achieve the same effect. The effective light source shape 10B uses s-polarized light that polarizes in a tangential direction of an annular shape for a first, annular part 12B from σin1 to σout in the effective light source 16B in order to resolve a fine pattern, and a non-polarized state that mixes the s-polarized light and p-polarized light for a second, annular part 14B from σin1 to σin2 in order to entirely resolve a non-fine pattern.

In other words, an effective light source shape at a pupil in the projection optical system makes the s-polarized light incident upon an axis parallel to a pattern period around the effective light source that is likely to rely upon a direction of the pattern period, and distributes the light that mixes s-polarized light and p-polarized light at part that do not depend upon the direction of the pattern period.

When the light intensity of the second part 14B from σin1 to σin2 is made smaller than that of the first part 12B outside σin1, the resolution for a fine pattern is maintained. The effective light source shape 10B does not to deteriorate resolution for a fine pattern by shielding the light of a part 18B as a light shielding part inside σin2.

Alternatively, an effective light source shape 10C shown in FIG. 1C may be used for a mask that composes mainly of patterns that extend in an X-axis direction and/or a Y-axis direction. The effective light source 10C uses s-polarized light that polarizes in abscissa and ordinate directions of an annular shape for a first, annular part 12C from σin to σout in the effective light source 16C in order to resolve a fine pattern, and a non-polarized state that mixes the s-polarized light and p-polarized light for a second, circular part 14C inside σin in order to entirely resolve a non-fine pattern.

When the mask pattern that composes mainly of patterns that extend in an X-axis and/or a Y-axis direction and the effective light source shape 10A shown in FIG. 1A is used as the effective light source, such polarization directions are undesirably included as contribute to resolution of patterns in a direction other than X-axis and Y-axis directions. These polarization components are not parallel to patterns, i.e., patterns that extend in an X-axis and/or a Y-axis direction, and the s-polarized light component reduces by that amount.

Therefore, when a mask pattern consists of patterns that extend in the X-axis direction and/or Y-axis direction, an effective light source that consists of polarization components parallel to the patterns, such as that shown in FIG. 1C, would rather improve resolution performance of an exposure apparatus and simplify a structure of an illumination system.

Of course, the resolution suitable for a fine pattern is maintained similar to the above, when the light intensity of the second part 14C inside σin is made smaller than that of the first part 12C outside σin, or when the light is shielded inside σin. A further effect may be expected when a mask pattern is provided with a polarization film that transmits particular polarized light.

Figure 3:
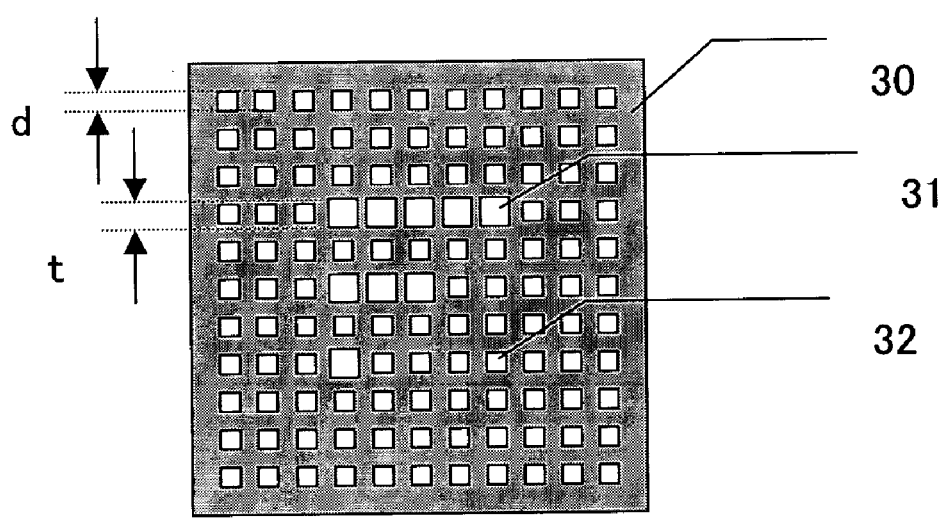
FIG. 3 is a schematic plane view of a desired pattern into which an auxiliary pattern has been inserted to resolve the desired contact hole pattern.
Figure 4:
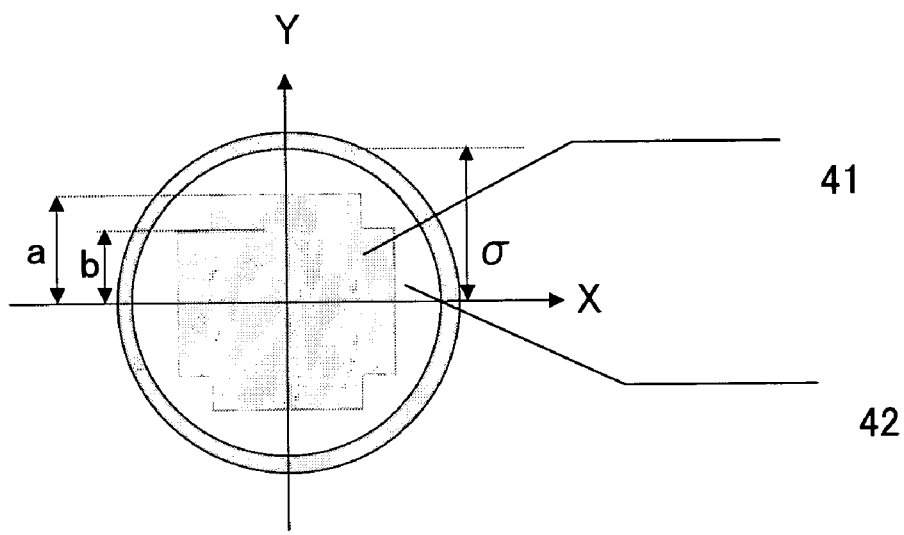
FIG. 4 is a schematic view showing an exemplary effective light source shape to resolve the mask pattern shown in FIG. 3.
Figure 10:
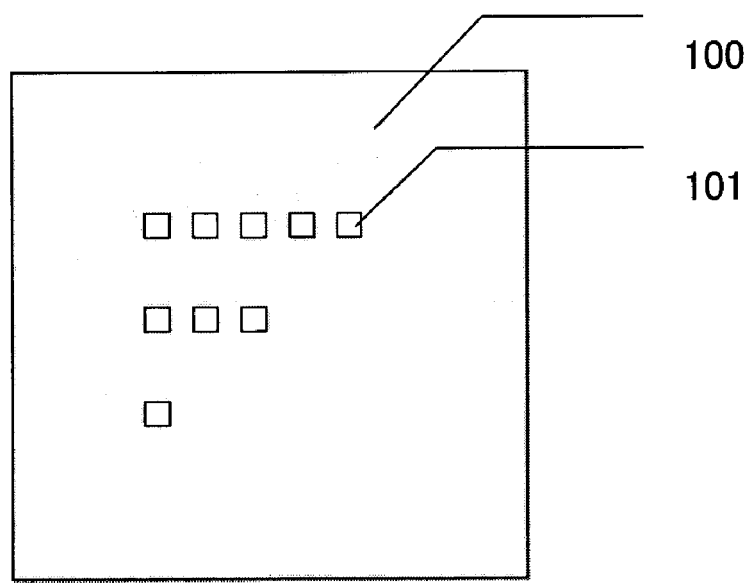
FIG. 10 is a schematic plane view of a mask pattern that arranges holes to form a contact hole pattern.

A description will be given of another example to resolve a contact hole pattern. While a mask pattern 101 shown in FIG. 10 is usually used to resolve a contact hole pattern 21 shown in FIG. 2, it is known that the resolving power improves when a mask pattern 30 is used as shown in FIG. 3 which arranges not only a desired pattern 31 to form the contact hole pattern 21 but also an auxiliary pattern 32 smaller than the desired pattern 31. An exposure method for resolving only the desired pattern 31 by illuminating a mask that includes such patterns with an effective light source shape 40 (FIG. 40) that includes a crossed light shielding part 41 and a circular effective light source 42 is referred to as "Exposure Method I". Here, FIG. 2 is a schematic plane view of the contact hole pattern 21. FIG. 3 is a schematic plane view of a mask pattern that inserts the auxiliary pattern 32 into the desired pattern 31. FIG. 4 is a schematic view showing one example of the effective light source 40 for resolving the mask pattern 30 shown in FIG. 3.

The mask shown in FIG. 3 is characterized in that it sets t/d to be 0.5, preferably 0.7 or greater where "t" is an aperture diameter of the desired pattern 31 to resolve the contact-hole pattern 21 and "d" is an aperture diameter of the unresolved auxiliary pattern 32 to assist the desired pattern 31 in resolving.

A description will now be given of the Exposure Method I in detail.

Only the desired contact hole pattern may be exposed with good resolving power onto an object, such as a wafer, by illuminating this mask 30 using plural types of light, such as crossed oblique incidence illumination (referred to as enhancement illumination part) to resolve the desired contact hole pattern, and illumination (referred to as restraint illumination part) to restrain the crossed oblique incidence illumination from resolving the auxiliary pattern (in other words, to limit the exposure dose for the auxiliary pattern (a little increased exposure dose) and to enhance the exposure dose for the desired contact-hole pattern (much increased exposure dose)).

Figure 22A:
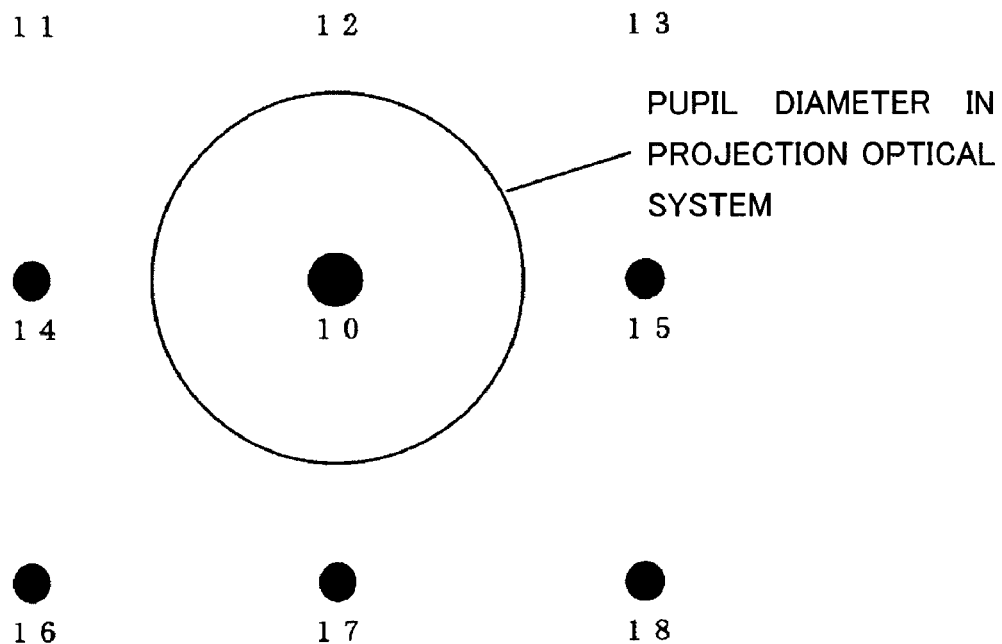
FIG. 22 is a schematic view showing positions of diffracted beams on a pupil surface for small σ illumination to a binary mask shown in FIG. 3, and moving positions of diffracted beams for oblique incidence illumination.

When the mask 30 that has a small pitch in the contact holes is illuminated with small σ illumination, diffracted beams deviate from the pupil surface in the projection optical system in the exposure apparatus except for the 0-th order diffracted beam. More specifically, there occur the 0-th order diffracted beam 10 and diffracted beams 11–18 of other orders as shown in FIG. 22A, and diffracted beams except for the 0-th order diffracted beam deviate from the pupil surface, whereby no pattern is formed under this condition. Here, FIG. 22A is a typical view showing positions of diffracted beams on the pupil surface in the projection optical system when the mask 30 is subject to small σ illumination.

Figure 22B:
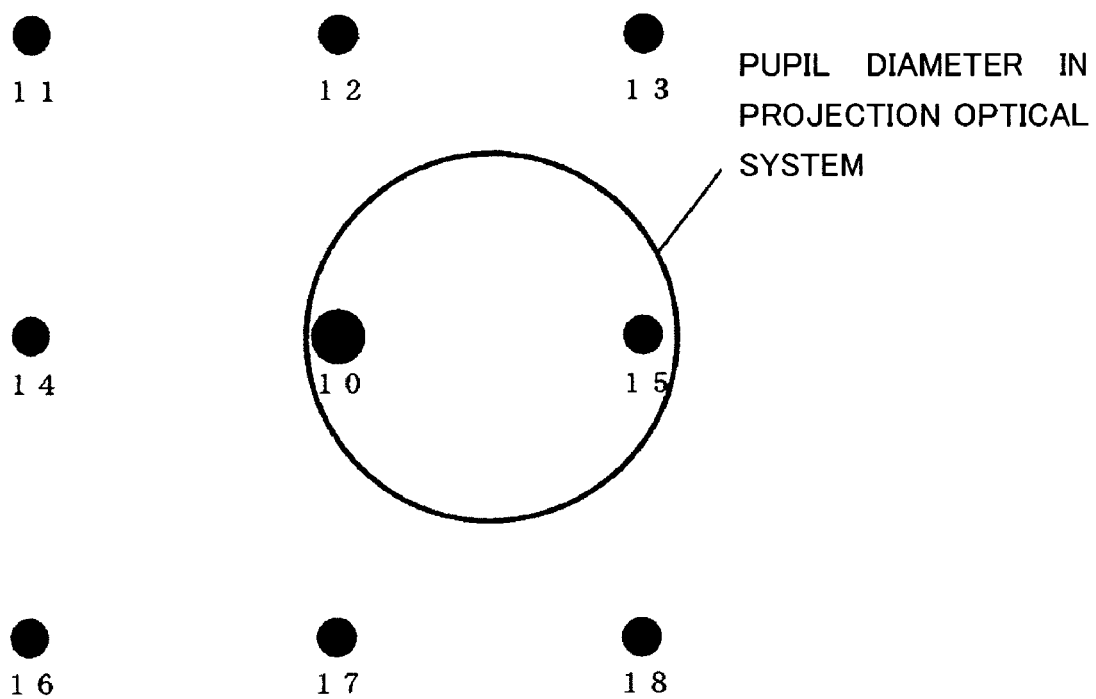

Therefore, illumination should allow the diffracted beams 11–18 to enter the pupil. For example, in order to allow illustrative two diffracted beams 10 and 15 to enter the pupil in the projection optical system shown in FIG. 22A, the illumination light may be moved to form oblique incidence illumination as shown in FIG. 22B. This oblique incidence illumination may enable the 0-th order diffracted beam and one of $\pm 1^{st}$ order diffracted beams 15 to enter both ends in the pupil in the projection optical system, and interference between these two diffracted beams incident upon the pupil forms linear interference bands at a regular pitch on the object.

Figure 23:
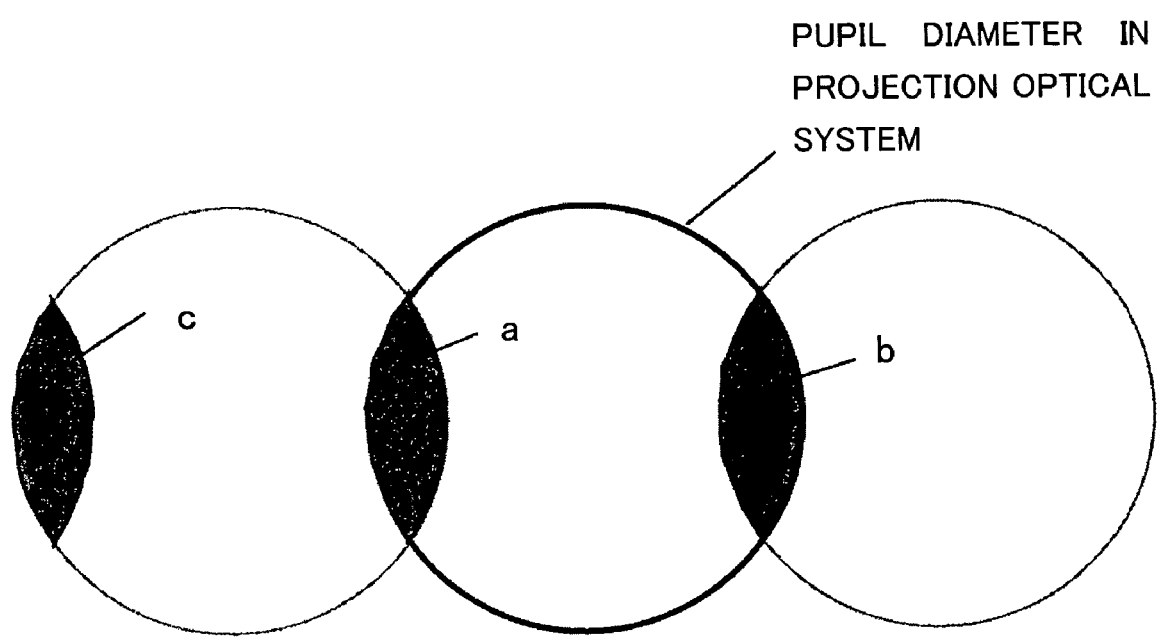
FIG. 23 is a view showing a relationship between $0^{th}$ order and $1^{th}$ order beams for oblique incidence illumination to a certain fine pitch pattern.

FIG. 23 shows a relationship between the 0-th order diffracted beam and the $1^{st}$ order diffracted beams in oblique incidence illumination for a mask pattern with fine pitches. The 0-th order diffracted beam for area "a" generates $\pm 1^{st}$ order diffracted beams like "b" and "c". In this figure, a shape of the area "a" allows one of $\pm 1^{st}$ order diffracted beams to enter the pupil. Left and right circles of the pupil in the projection optical system have the same diameter as the pupil diameter in the projection optical system, and their centers are offset from the center of the pupil by a predetermined amount or an interval between 10 and 15 in FIG. 22. In other words, the oblique incidence illumination that arranges all the 0-th order diffracted beam in the area "a" enables one of $\pm 1^{st}$ order diffracted beams 15 to enter the pupil, and interference between these two diffracted beams forms linear interference bands at a regular pitch on the object.

Similarly, the oblique incidence illumination that arranges the 0-th order diffracted beam in the area "b" shown in FIG. 23 enables one of $\pm 1^{st}$ order diffracted beams 15 to enter the pupil in the area "a".

Figure 24:
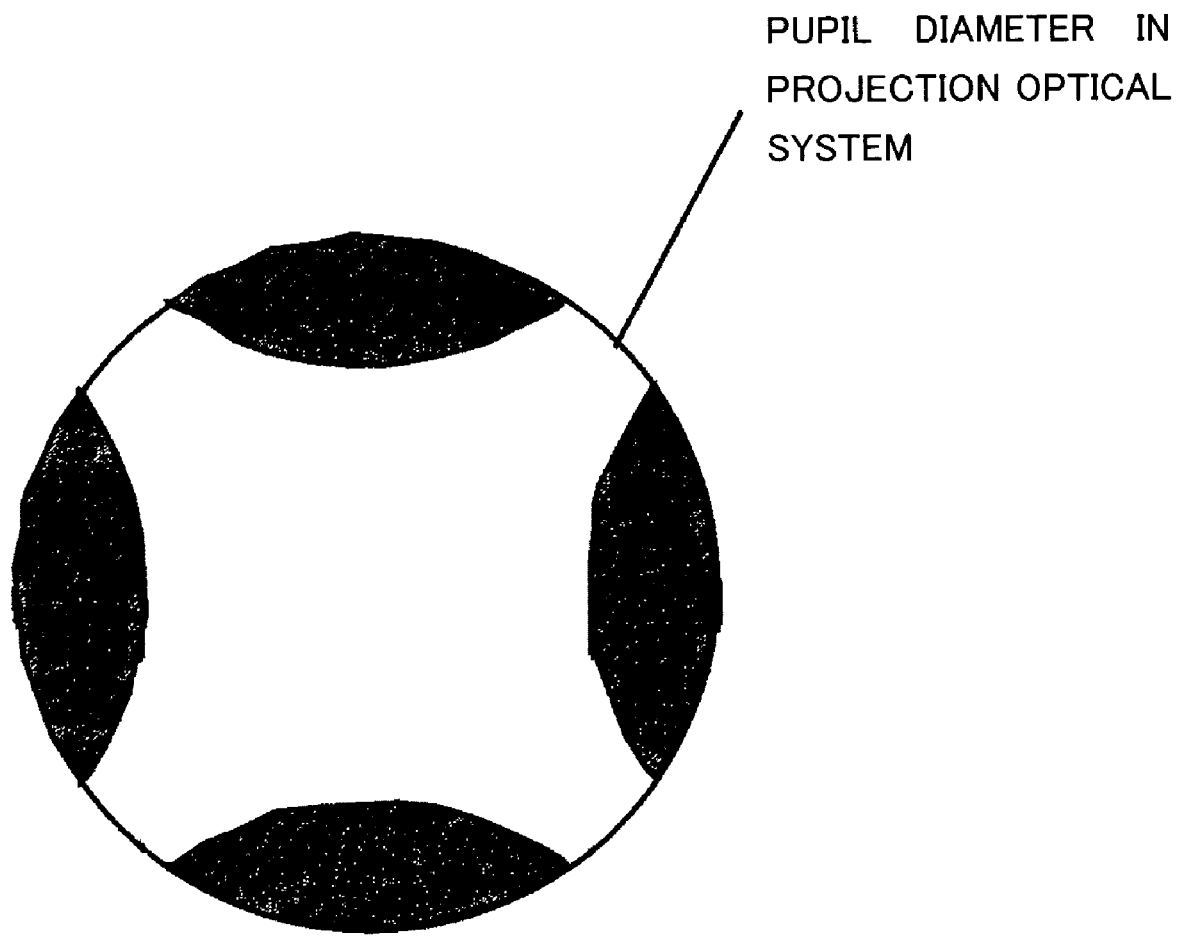
FIG. 24 is a view that combines four streamlined effective light-source areas (or $0^{th}$ order beam areas) as partial overlap of two circles.

As shown in FIG. 24, four streamlined effective light-source areas as a combination area of two circles would form linear fringe bands on an object to be exposed at a regular pitch in longitudinal and lateral directions, and strong and weak parts appear at two-dimensional pitches at intersection points overlapping light intensity distributions. In other words, the above enhancement illumination part corresponds to four (beveled) streamlined areas having a longitudinal direction in a direction orthogonal to a radial direction of crossed pupil as shown in FIG. 24. The other part (i.e., part other than beveled part in the pupil in the projection optical system) corresponds to the above restraint illumination part.

Figure 25A:
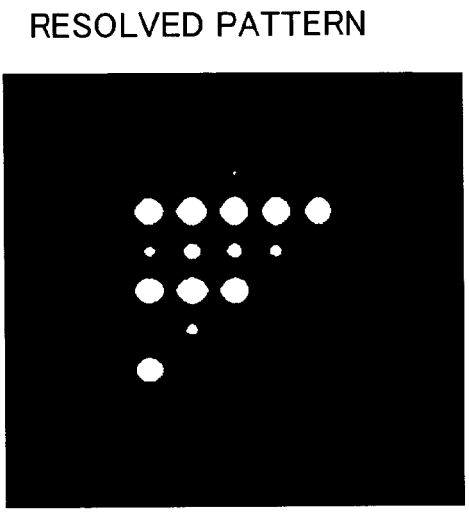
FIG. 25 is a view of simulated resolution pattern on an object to be exposed.
Figure 25A:
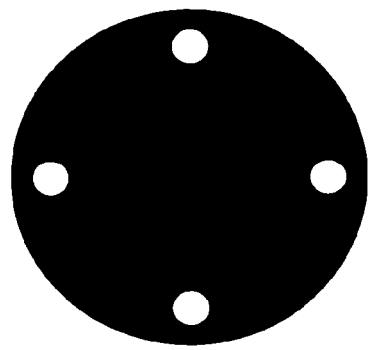
Figure 25B:
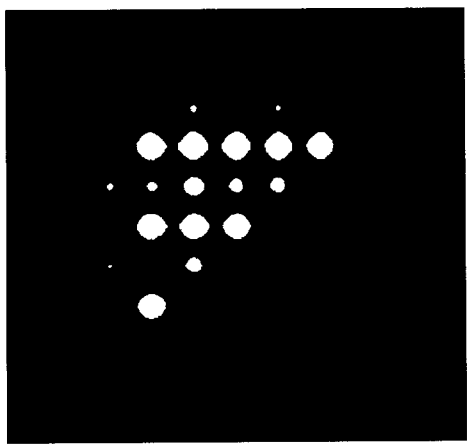
Figure 25B:
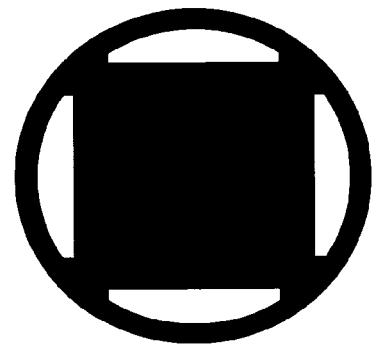
Figure 25C:
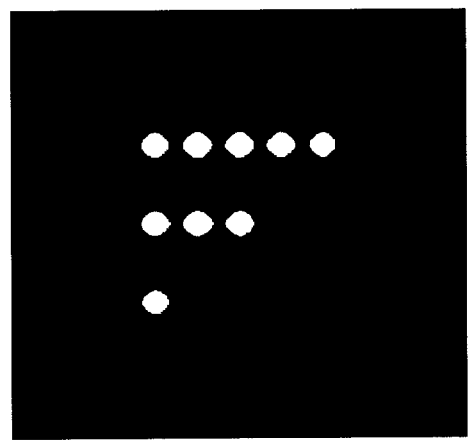
Figure 25C:
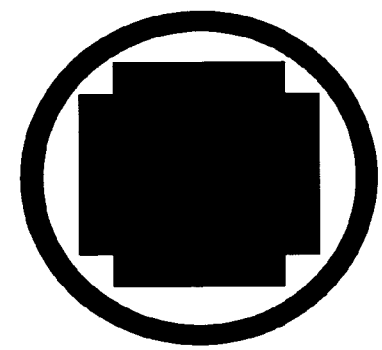

The desired contact-hole pattern 31 on the mask 30 is made larger than the auxiliary pattern 32 and thus has stronger light intensity than the peripheral, forming the desired contact hole pattern. However, as shown in FIGS. 25A and 25B, the mere crossed oblique incidence illumination would result in the resolution of the auxiliary pattern, creating an unnecessary pattern other than the desired contact-hole pattern. Here, FIG. 25 is a view of simulated resolved pattern on the object corresponding to the right effective light source shape.

Figure 26:
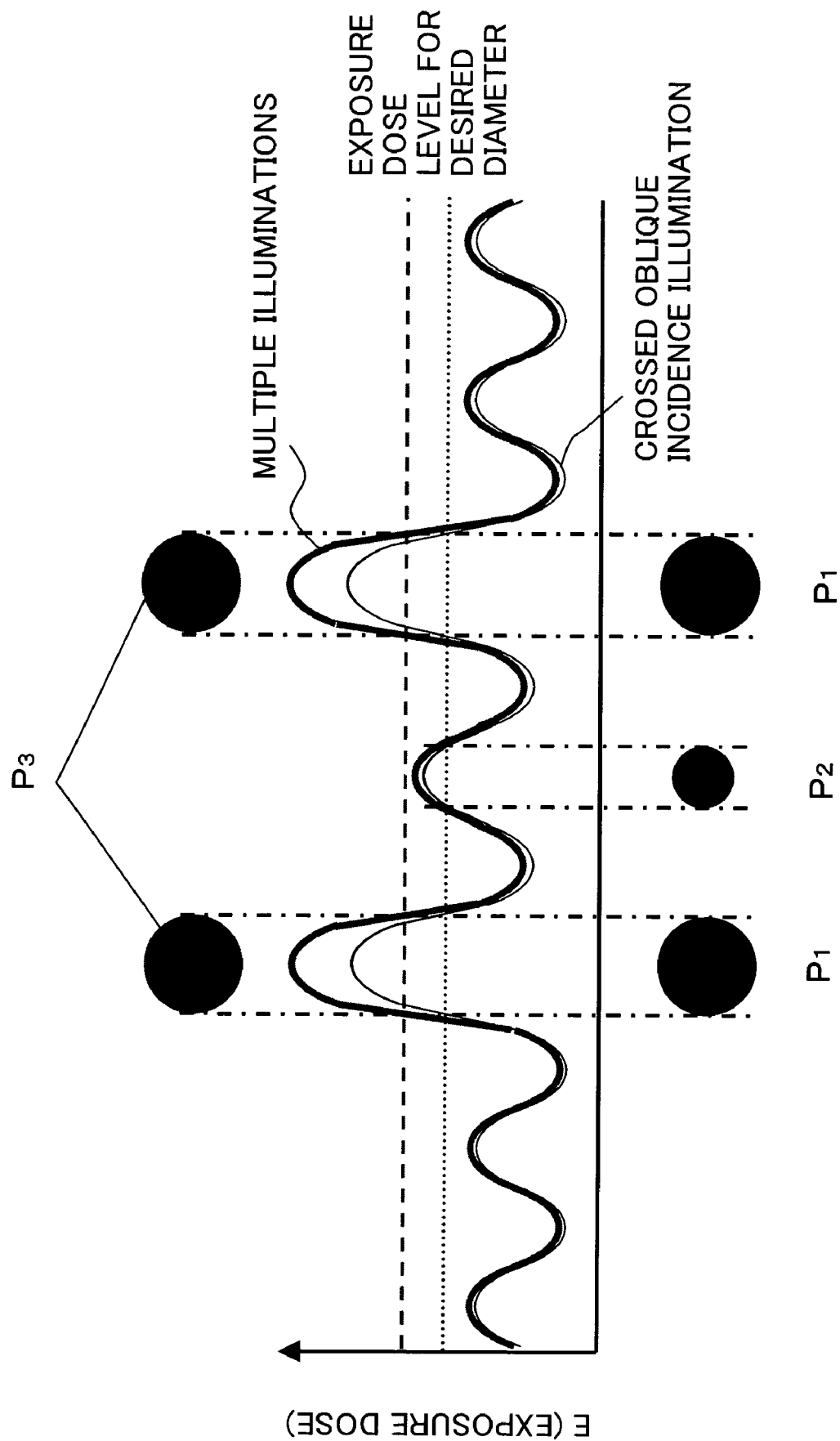
FIG. 26 is a view showing exposure dose in modified illumination and an image on the object to be exposed corresponding to the exposure dose.

As shown in FIG. 26, the exposure dose of a thin solid ray resolves not only the desired pattern P1 but also auxiliary pattern P2 when sliced at the exposure-dose threshold or resist threshold shown by a thin dotted line in FIG. 26 where the desired contact hole pattern P1 has a desired diameter value. Here, FIG. 26 shows the exposure dose and an image on the object corresponding to the exposure dose for the crossed oblique incidence illumination and inventive modified illumination.

Figure 27:
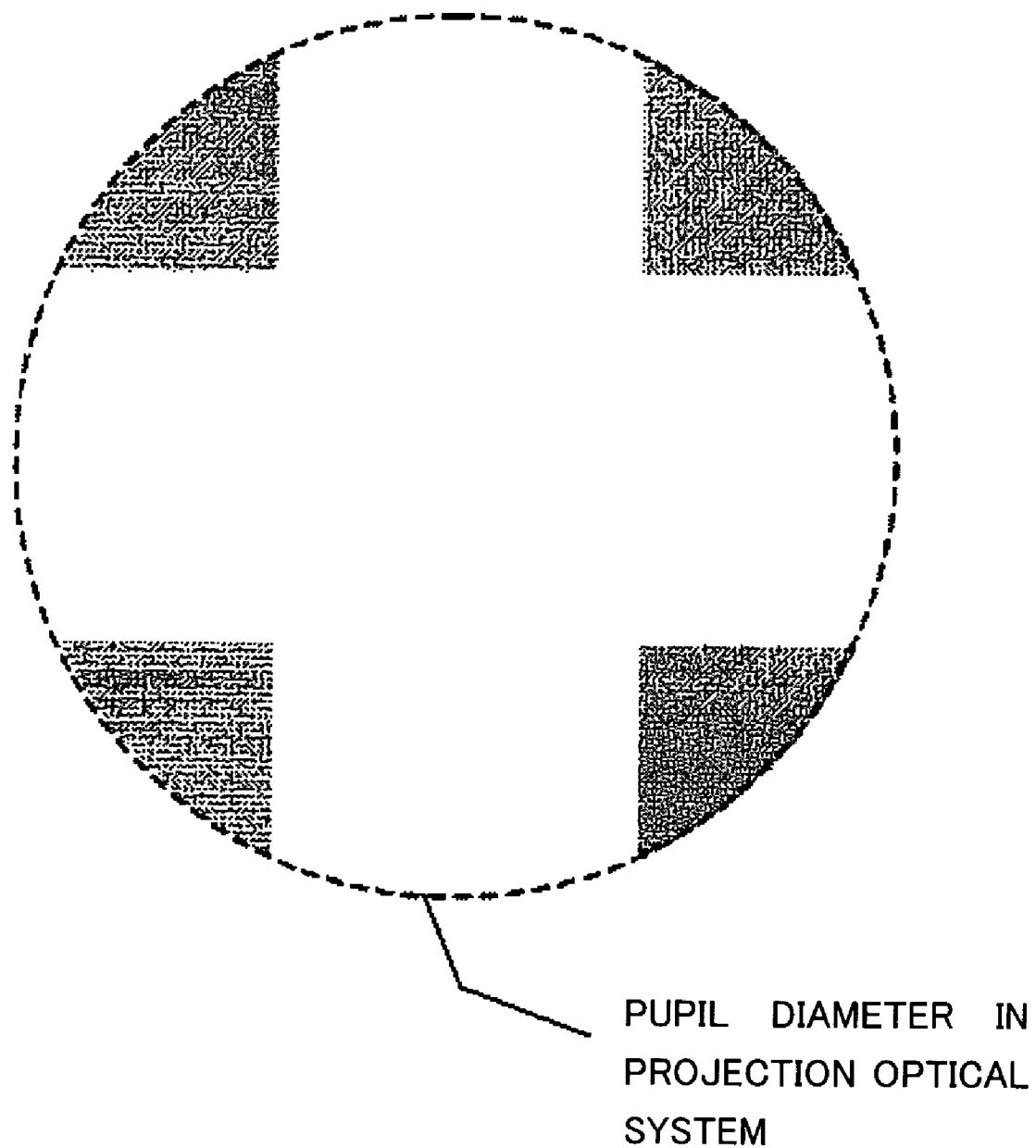
FIG. 27 is a typical view for explaining an effective light source shape.

Accordingly, it is conceivable to add the effective light source distribution, i.e., the above restraint illumination part that allows only one diffracted beam to enter the pupil surface, to the effective light source distribution shown in FIG. 24. Preferably, the diffracted beam is the 0-th order diffracted light as the only one diffracted beam. FIG. 27 shows an exemplary effective light source distribution.

Figure 28:
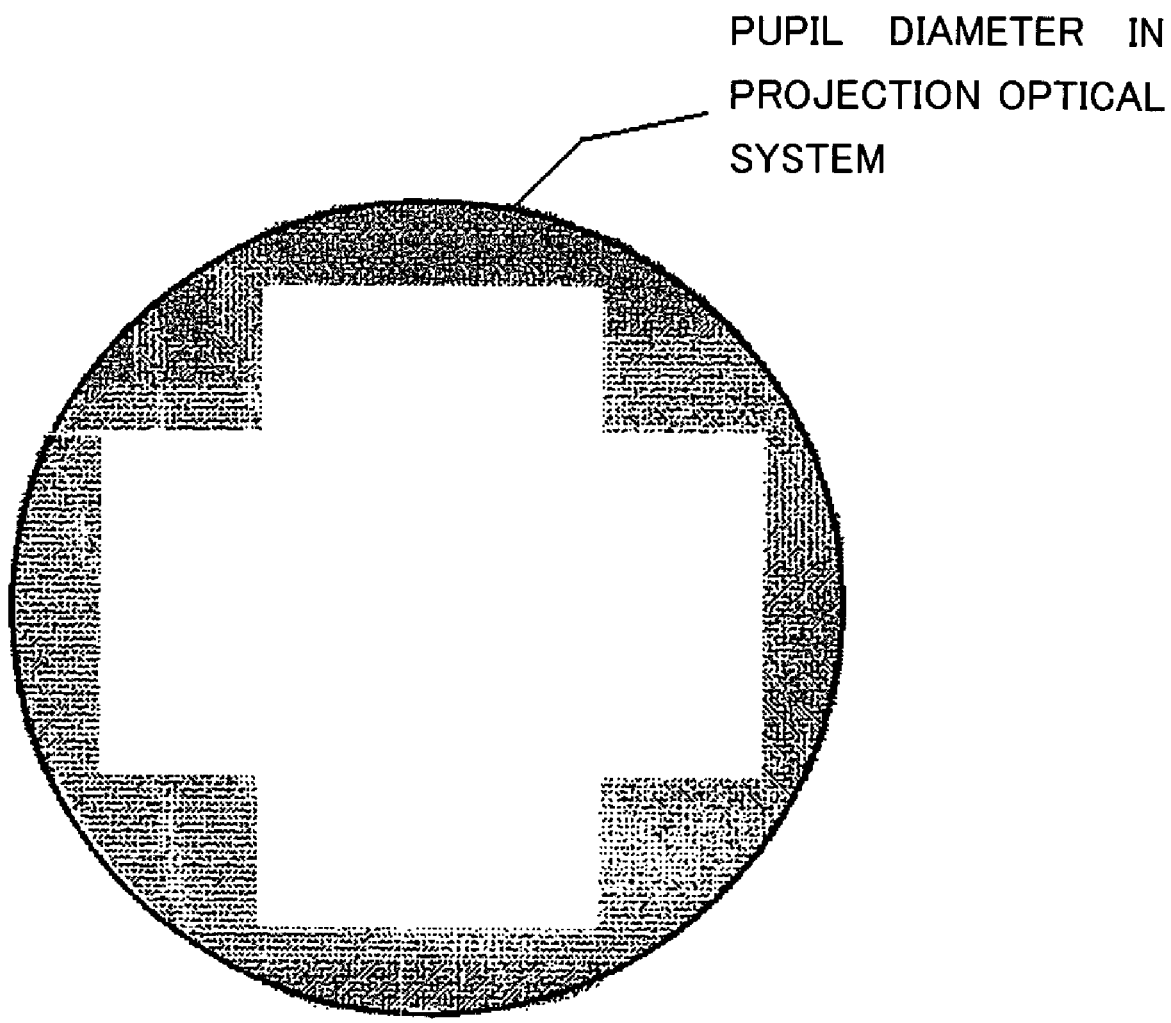
FIG. 28 is a typical view for explaining an effective light source shape.

The exposure dose shows like a thick solid ray as shown in FIG. 26 when the mask 30 is illuminated using an effective light source distribution shown in FIG. 28 that has a crossed blank at its center and is close to an addition between the effective light source distribution shown in FIG. 24 that allows two diffracted beams to enter the pupil and the effective light-source distribution shown in FIG. 27 that enables one diffracted beam to enter the pupil. That is, the exposure dose particularly increases at part corresponding to the desired contact hole pattern 31 on the mask 30, and provides the desired pattern P3 in which the dummy resolution pattern P2 disappears at the exposure dose threshold or resist threshold shown by a thick dotted line in FIG. 26 where the desired contact-hole pattern has a desired diameter value.

Figure 5A:
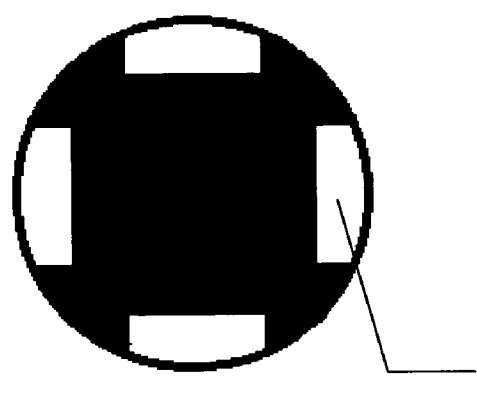
FIG. 5A is a plane view that typically shows part that contributes resolution of a desired pattern.
Figure 5B:
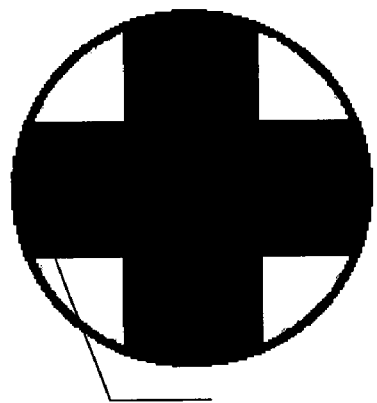
FIG. 5B is a plane view that typically shows part that restrains an auxiliary pattern from resolving.

In summary, Exposure Method I characteristically uses the effective light source shape 40 shown in FIG. 4, which has two functions understandably. In other words, the effective light source shape 40 may be divided into two, as shown in FIGS. 5A and 5B. Four parts 51 in FIG. 5A serve to effectively resolve the desired pattern 31, but they result in possibly resolving the auxiliary pattern 32 around the desired pattern 31. On the other hand, four parts 52 in FIG. 5B clarify an outline of the desired pattern 31 and serve to restrain the auxiliary pattern 32 from resolving. Therefore, only the desired pattern 31 resolves and the auxiliary pattern 32 does not when the mask 30 shown in FIG. 3 is exposed with the effective light source shape 40 shown in FIG. 4. Here, FIG. 5 is a plane view that dissolves the effective light-source shape 40 shown in FIG. 4 into two, FIG. 5A is a schematic plane view of the part 51 that contribute to resolution of the desired pattern 31, and FIG. 5B is a schematic plane view of the part 52 that restrains the auxiliary pattern 32 from resolving.

The above Exposure Method I may also employ an effective light source that controls polarization directions. More specifically, the effective light source shape 40 forms an effective light source shown in FIG. 6A which uses s-polarized light for four parts 51 for resolving the fine desired pattern 31, and an effective light source shown in FIG. 6B which uses a non-polarized light that mixes s-polarized light and p-polarized light for the part 52 for emphasizing an outline of the desired pattern 31. Thus, the effective light source shape 40 is suitable for the Exposure Method I, since it combines effective light sources shown in FIGS. 6A and 6B, and its polarization directions are controlled as shown in FIG. 7.

In other words, the effective light source shape on a pupil in the projection optical system makes the s-polarized light incident upon an axis that is parallel to a pattern period around the effective light source and passes through a center of the pupil, and distributes the light that mixes s-polarized light and p-polarized light on other part.

Figure 6A:
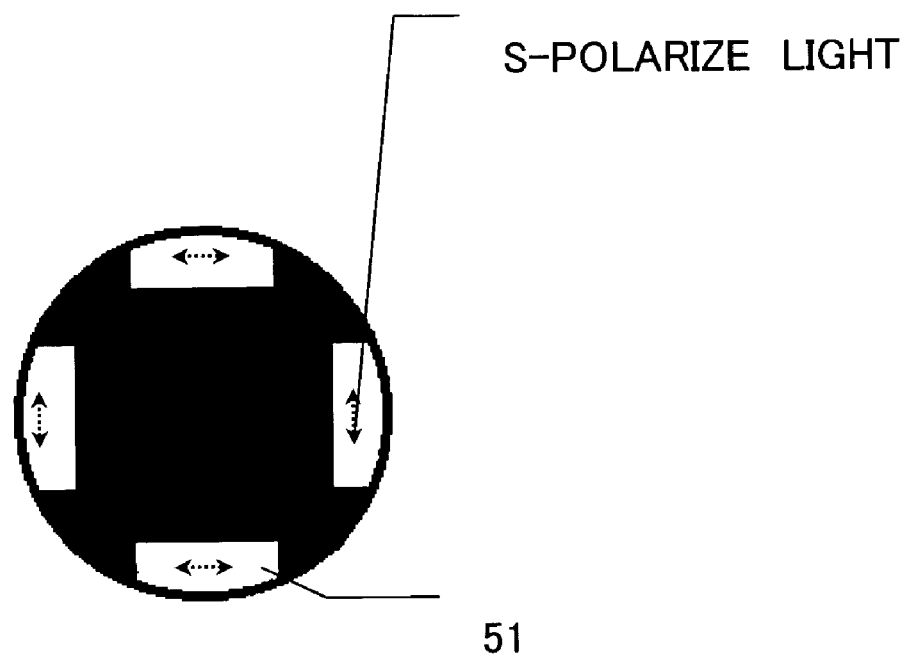
FIG. 6A is a plane view showing polarization directions of part that contribute to resolution of a desired pattern.
Figure 6B:
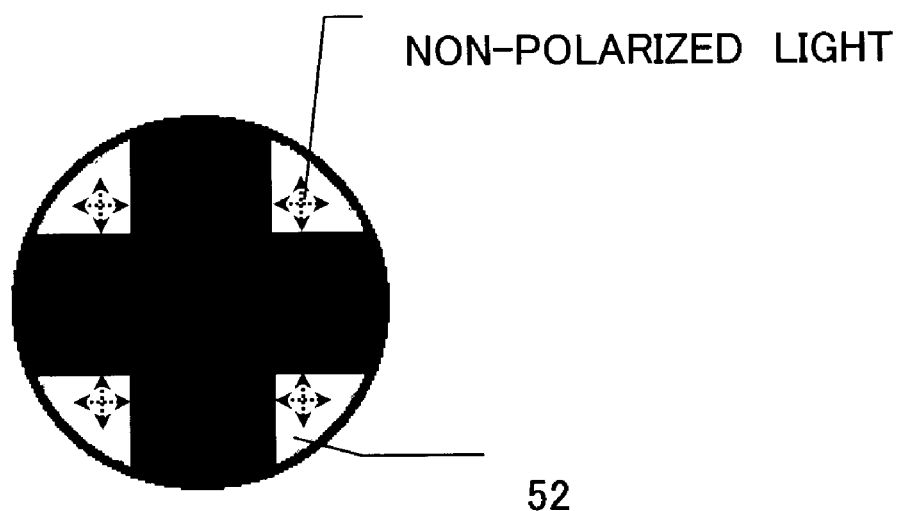
FIG. 6B is a plane view that typically shows polarization directions of part that restrains an auxiliary pattern from resolving.
Figure 7:
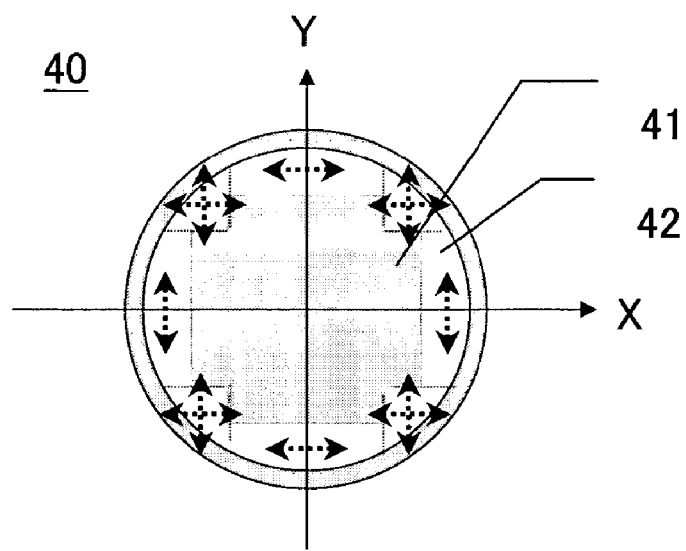
FIG. 7 is a plane view that typically shows the effective light source shape shown in FIG. 4 which has controlled polarization directions.

The effective light source 40 shown in FIG. 7 is effective to the usual exposure as well as the Exposure Method I. Here, FIG. 6A is a plane view that typically shows a polarization direction of the part 51 that contributes to resolution of the desired pattern 31, and FIG. 6B is a plane view that typically shows a polarization direction of the part 52 that restrains resolution of the auxiliary pattern 32. FIG. 7 is a plane view that typically shows the effective light source shape 40 whose polarization direction is controlled.

Figure 8:
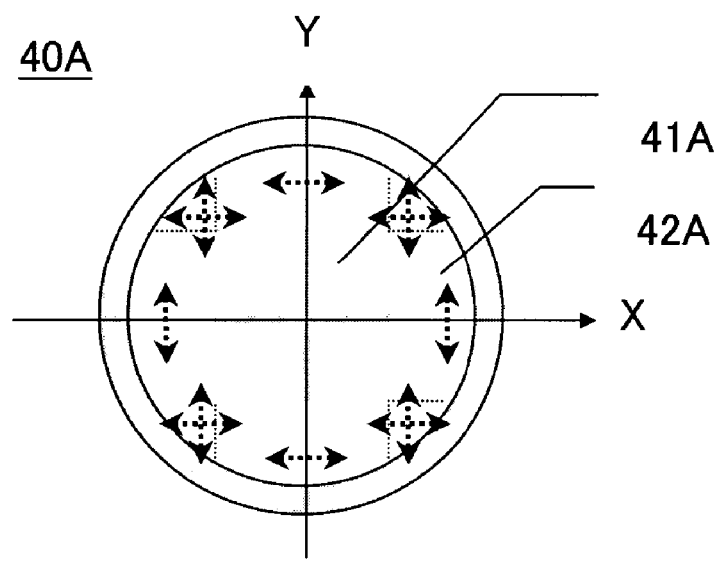
FIG. 8 is a plane view that typically shows the effective light source shape as a variation of the effective light source shape shown in FIG. 7.

An effective light source shape 40A shown in FIG. 8 may be used as a variation of the effective light source shape 40 shown in FIG. 7. The effective light source shape 40A includes a rectangular light shielding part 41A and a circular effective light source 42A outside the light shielding part 41A. The effective light source shape 40A shown in FIG. 8 is useful for the Exposure Method I when polarized light in longitudinal and lateral directions, i.e., directions parallel to the X-axis and Y-axis directions are controlled to be s-polarized light, and an oblique direction, i.e., a direction that forms 45° relative to the X-axis and Y-axis direction is controlled to be a non-polarized light that mixes s-polarized light and p-polarized light. Here, FIG. 8 is a plane view that typically shows the effective light source shape 40A as a variation of the effective light source shape 40 shown in FIG. 7.

Figure 9:
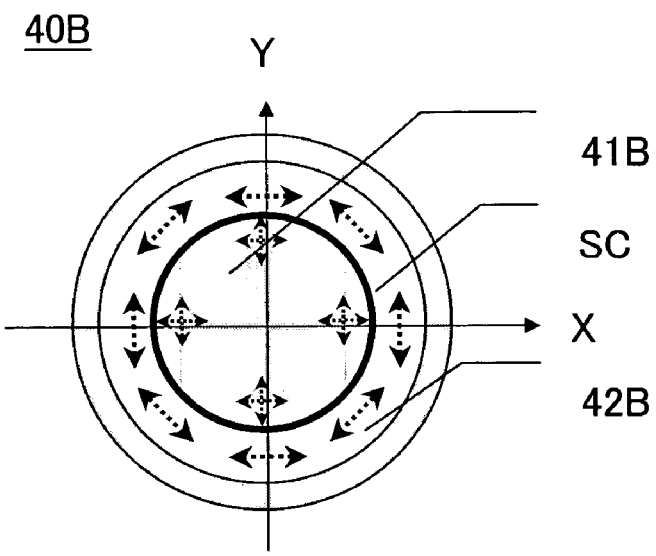
FIG. 9 is a plane view that typically shows an effective light source shape as a variation of the effective light source shape shown in FIG. 8.

An effective light source shape 40B shown in FIG. 9 is also useful for the Exposure Method I when the effective light source shape 40A directs polarized light outside a circle SC that contains the rectangular light shielding part 41A to a tangential direction of the circle SC, and sets polarized light inside the circle SC to be a non-polarized light that mixes s-polarized light and p-polarized light. While the circle SC in FIG. 9 contacts the light shielding part 41A, its radius may be made larger according to critical dimensions in a pattern, etc. The effective light source shapes 40A and 40B are also useful like the effective light source shape 40, for normal exposures as well as the Exposure Method I. Here, FIG. 9 is a plane view that typically shows the effective light source shape 40B as a variation of the effective light source shape 40A shown in FIG. 8.

A description will now be given of a result of simulation that assumes an exposure apparatus that uses KrF excimer laser having a wavelength of 248 nm as a light source and a NA of its projection optical system of 0.9. The projection exposure apparatus generally provides a reduction projection exposure. In case of reduction projection exposure, the pattern size to be produced is different from a mask pattern by a magnification depending upon the exposure apparatus. The magnification of the exposure apparatus depends upon its machine type, and this application converts the pattern size on the mask into the size on the wafer or an object to be exposed.

For example, for a pattern of 120 nm on the wafer, when the magnification on the projection exposure apparatus is 0.25, a pattern of 480 nm should be actually formed on the mask, and when the magnification on the projection exposure apparatus is 0.20, a pattern of 600 nm should be formed on the mask. However, for simplicity purposes, the instant application converts the size of the mask pattern into the size on the wafer or object to be exposed, and calls the pattern of 120 nm.

EXAMPLE

The target pattern sets pitch in a lateral direction p=180 nm, i.e., a hole diameter to be a contact hole pattern 21 of 90 nm, a hole pitch in a transverse direction to be 90 nm, and a hole pitch in a longitudinal direction as 2p=360 nm in FIG. 2. A usual binary mask has a difficulty in exposing such a fine pattern, and the Exposure Method I is used preferably.

The effective light source shape 40 having a crossed light shielding part 41 may be used to expose the mask shown in FIG. 3 that inserts the auxiliary pattern 32 of 70 nm into a period of 180 nm in longitudinal and lateral directions, wherein the effective light source shape 40 shown in FIG. 4 has σ=0.9, a=0.7 and b=0.55.

Figure 11A:
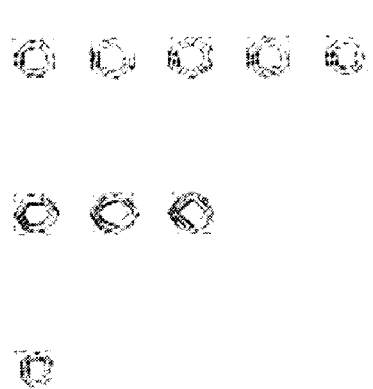
FIG. 11 is a view that shows a simulation result of an aerial image in one embodiment.

FIG. 11A shows a resultant two-dimensional aerial image at the time of best focus for simulation that uses the effective light source 40 in a non-polarization state.

Figure 11B:
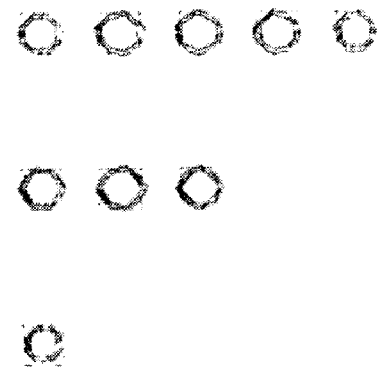

On the other hand, FIG. 11B shows a resultant two-dimensional aerial image at the time of best focus for simulation that uses the effective light source 40A shown in FIG. 7 that provides tangential polarization in longitudinal and lateral directions and a non-polarization in an oblique direction.

Referring to FIGS. 11A and 11B, the effective light source shape 40A that controls polarization results in a sharper aerial image of the desired pattern 31 than that using the effective light source shape 40 in a non-polarization.

It is understood that a non-polarization state shown in FIG. 11A blurs an image and lowers contrast, while FIG. 11B provides a sharp image close to an image obtained in the scalar theory. While the contrast drop as seen in the non-polarization state is a big issue in resolving a fine pattern, it has been discovered that use of the Exposure Method I and effective light source shape 40A that controls polarization may resolve a fine pattern. A periodic pattern is subject to an effect of controlled polarization, and the Exposure Method I although pseudo may relatively easily obtain an effect of illumination that controls polarization so as to form a periodic pattern.

The instant example has been confirmed that an effect of an effective light source that controls polarization in the Exposure Method I, in particular, an effect of the effective light source shape 40A shown in FIG. 7. Similarly, the effects of the effective light source shapes 40 and 40B shown in FIGS. 8 and 9 are also confirmed.

While a description of the instant example uses NA=0.9, this exposure method is advantageously useful for higher NA and finer patterns. More apparent effect may be seen in immersion exposure using NA equal to or greater than 0.1. Since it is generally reported that influence of polarization for high NA starts when NA is equal to or larger than 0.70, NA smaller than 0.9 also achieve similar effects.

The effective light source shapes that control polarization as shown in FIGS. 1, 7 to 9 are implemented as a shape of an aperture stop 174 arranged just after an exit surface of an optical integrator 172 as a pupil surface in the illumination optical system 170 in an exposure apparatus in FIG. 16. The aperture stop 174 is provided at a position approximately conjugate with a pupil in a projection optical system OP in the exposure apparatus, and an aperture shape of the aperture stop corresponds to an effective light source shape on the pupil surface in the projection optical system. Therefore, the effective light source shape 10B shown in FIG. 1 is implemented as an aperture stop 10B that has the light transmission parts 12B and 14B, and light shielding part 18B. The effective light source shape 40 shown in FIG. 7 is implemented as the aperture stop 40 that has light transmitting part 42 and light shielding part 41. The effective light source shape 40A shown in FIG. 8 is implemented as the aperture stop 40A that has light transmitting part 42A and light shielding part 41A. The effective light source shape 40B shown in FIG. 9 is implemented as the aperture stop 40B that has light transmitting part 42B and light shielding part 41B. An illumination optical system and exposure apparatus having the above aperture stop, or an exposure apparatus having an exposure mode that may execute an exposure method that controls polarization as discussed.

Figure 20:
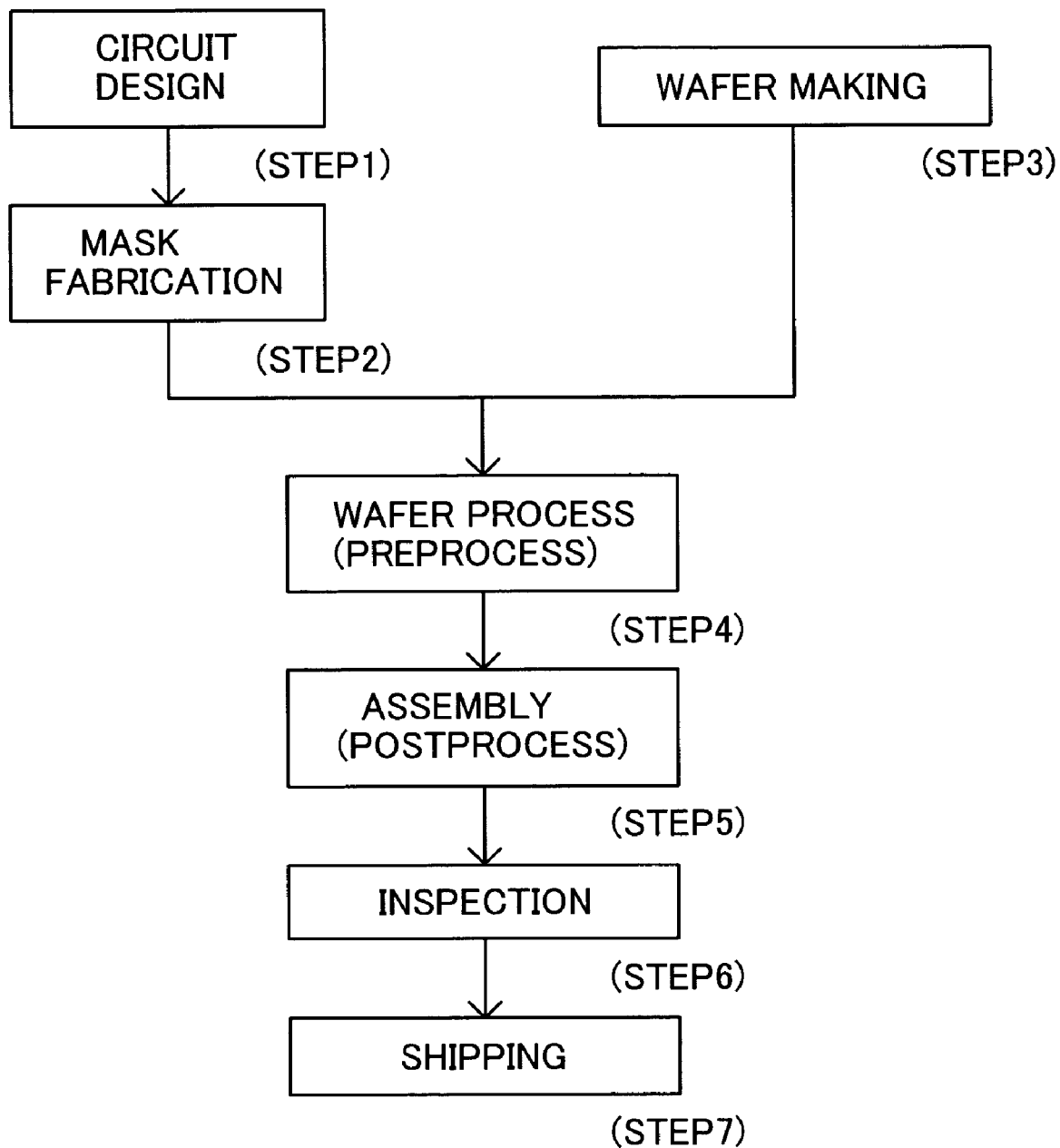
FIG. 20 is a flowchart for explaining how to fabricate devices (such as semiconductor chips such as ICs and LCDs, CCDs, and the like).
Figure 21:
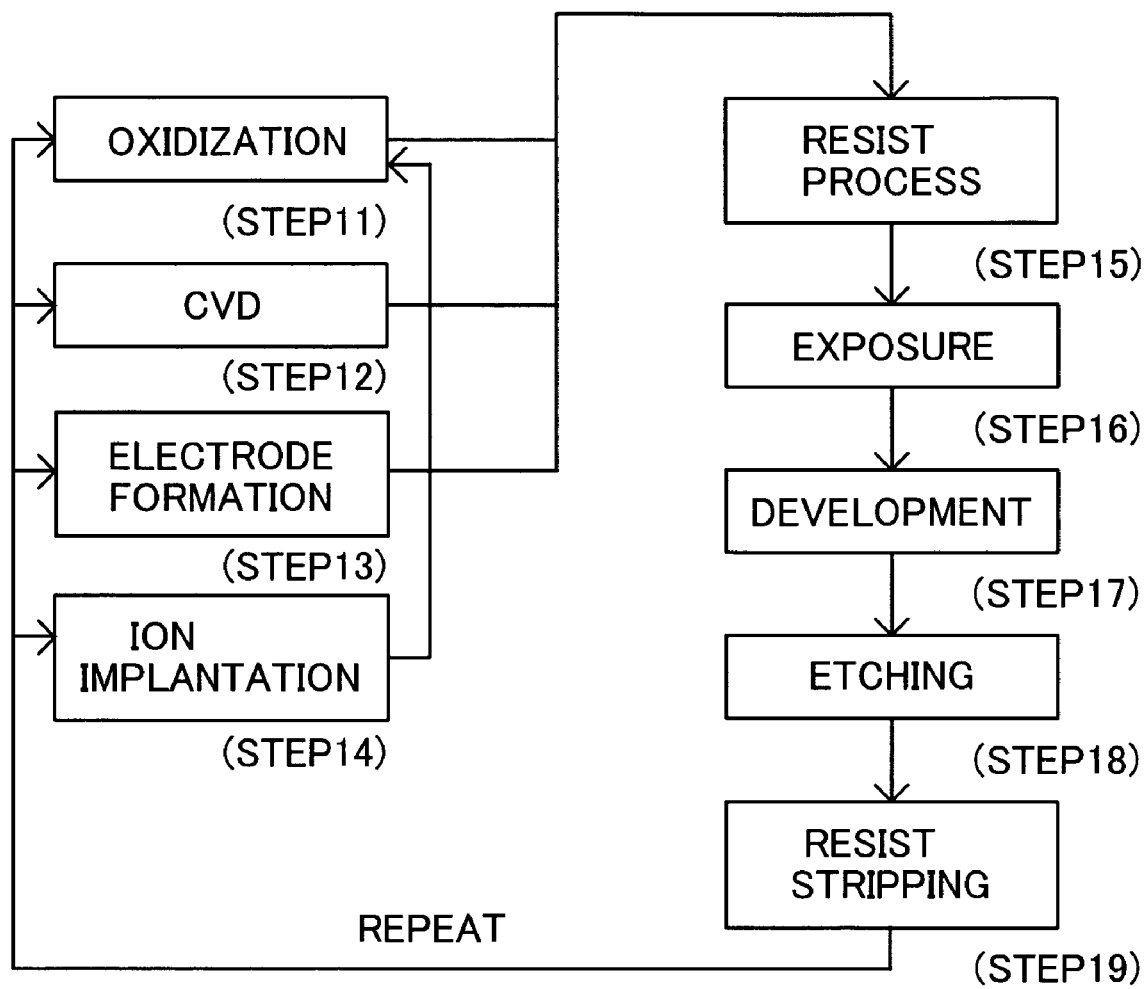
FIG. 21 is a detail flowchart of a wafer process as Step 4 shown in FIG. 20.

Referring now to FIGS. 20 and 21, a description will be given of an embodiment of a device fabricating method using the above exposure apparatus. FIG. 20 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 21 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, a device fabrication method using the inventive lithography and resultant devices constitute one aspect of the present invention. While the object to be processed illustratively uses a silicon wafer, a glass plate, a spherical semiconductor, etc. may be used for the object.

Further, the present invention is not limited to these preferred embodiments, and various variations and modifications may be made without departing from the scope of the present invention.

As discussed, the inventive exposure method may prevent deteriorated imaging performance due to influence of polarization and may form desired patterns.

What is claimed is:

1. An exposure method for exposing a pattern of a mask onto an object, said method comprising the steps of:
   illuminating the mask using an illumination system that forms an effective light source having a first part that mainly includes s-polarized light and a second part that mixes s-polarized light and p-polarized light, the first and second parts having different light intensities; and
   projecting, through a projection optical system having the effective light source at its pupil plane, and a numerical aperture of 0.9 or greater, a pattern of the mask onto an object to be exposed.

2. An exposure method according to claim 1, wherein the first part of the effective light source has an annular shape.

3. An exposure method according to claim 2, wherein the second part of the effective light source has a circular shape that is located inside the first part of the effective light source.

4. An exposure method according to claim 2, wherein the second part of the effective light source has an annular shape corresponding to the shape of the aperture stop that is located inside the first part of the effective light source.

5. An exposure method according to claim 1, wherein light intensity of the second part of the effective light source is smaller than that of the first part.

6. An exposure method according to claim 1, wherein the pattern of the mask has plural line patterns, and the second part is located outside the first part.

7. An exposure method according to claim 1, wherein the pattern of the mask has plural hole patterns that are arranged longitudinally and laterally, the first part is arranged longitudinally and/or laterally, and the second part is arranged obliquely.

8. An exposure method according to claim 7, wherein the effective light source has a cross-shaped light-shielding part.

* * * * *